United States Patent
Park et al.

(10) Patent No.: US 12,484,413 B2
(45) Date of Patent: Nov. 25, 2025

(54) LIGHT EMITTING DISPLAY DEVICE

(71) Applicant: LG Display Co., Ltd., Seoul (KR)

(72) Inventors: Sae Mi Park, Paju-si (KR); Myeong Seon Cho, Paju-si (KR); Wook Song, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 546 days.

(21) Appl. No.: 18/071,697

(22) Filed: Nov. 30, 2022

(65) Prior Publication Data

US 2023/0217770 A1   Jul. 6, 2023

(30) Foreign Application Priority Data

Dec. 31, 2021   (KR) .......................... 10-2021-0194770

(51) Int. Cl.
*H10K 59/38*   (2023.01)
*H10K 59/12*   (2023.01)

(52) U.S. Cl.
CPC ............ *H10K 59/38* (2023.02); *H10K 59/12* (2023.02)

(58) Field of Classification Search
CPC ............................... H10K 59/38; H10K 59/12
See application file for complete search history.

(56) References Cited

U.S. PATENT DOCUMENTS

| | | | |
|---|---|---|---|
| 8,304,265 B2 | 11/2012 | Nakamura et al. | |
| 8,446,091 B2 | 5/2013 | Nakamura et al. | |
| 10,317,740 B2 * | 6/2019 | Lee | G02B 5/02 |
| 11,233,093 B2 * | 1/2022 | Choi | H10K 59/878 |
| 2006/0158403 A1 | 7/2006 | Kuma | |
| 2011/0155296 A1 | 6/2011 | Nakamura et al. | |
| 2013/0038205 A1 | 2/2013 | Nakamura et al. | |
| 2015/0085223 A1 * | 3/2015 | Park | H10K 59/38 |
| | | | 349/65 |
| 2020/0203448 A1 * | 6/2020 | Kim | H10K 59/35 |
| 2020/0212269 A1 * | 7/2020 | Akimoto | H10F 39/182 |
| 2021/0066403 A1 * | 3/2021 | Wang | H10K 50/852 |
| 2021/0175456 A1 | 6/2021 | Song et al. | |
| 2022/0115447 A1 * | 4/2022 | Ishizuya | H10K 59/879 |
| 2024/0260326 A1 * | 8/2024 | Lee | H10K 59/122 |

FOREIGN PATENT DOCUMENTS

| | | |
|---|---|---|
| KR | 10-2007-0042153 A | 4/2007 |
| KR | 10-1391326 B1 | 5/2014 |
| KR | 10-2015-0034047 A | 4/2015 |
| KR | 10-2020-0023863 A | 3/2020 |
| KR | 10-2021-0071572 A | 6/2021 |

OTHER PUBLICATIONS

Korean Intellectual Property Office, Office Action, Korean Patent Application No. 10-2021-0194770, Oct. 14, 2025, 11 pages.

* cited by examiner

*Primary Examiner* — Mary Ellen Bowman
(74) *Attorney, Agent, or Firm* — Fenwick & West LLP

(57) ABSTRACT

Disclosed is a light emitting display device configured to have a structure in which an auxiliary conversion portion including color conversion layers having different transmission characteristics and overlapping each other is applied to a non-emission portion of a subpixel, whereby luminous efficacy is improved and current-density-specific color purity is equalized, and therefore image quality is improved.

20 Claims, 24 Drawing Sheets

LIGHT EMITTING DISPLAY DEVICE

CROSS REFERENCE TO RELATED APPLICATIONS

This application claims the benefit of Korean Patent Application No. 10-2021-0194770, filed on Dec. 31, 2021, which is hereby incorporated by reference as if fully set forth herein.

BACKGROUND OF THE DISCLOSURE

Field of the Disclosure

The present disclosure relates to a display device, and more particularly to a light emitting display device configured such that an auxiliary conversion layer is provided in a non-emission portion, whereby luminous efficacy is improved and color purity is equalized irrespective of current density, and therefore image quality is improved.

Discussion of the Related Art

With recent approach to a full-scale information age, displays capable of visually expressing electrical information signals have been rapidly developed. Correspondingly, various display devices having excellent performance, such as slimness, light weight, and low power consumption, have been developed and have rapidly replaced a conventional cathode ray tube (CRT).

Among the display devices, a light emitting display device has been considered as a competitive application in order to achieve compaction of the device and vivid color display without necessity of a separate light source.

Meanwhile, in the light emitting display device, a light emitting element having an emission layer is disposed between opposite electrodes. In forming the light emitting element, a tandem element formation method is mainly used to achieve process convenience and yield improvement in a large-area display device.

Meanwhile, in the tandem element, different emission layers overlap over adjacent subpixels. Even when only a certain subpixel is turned on, therefore, the subpixel may be affected by side leakage current from a subpixel adjacent thereto. In particular, a change in color coordinates of a red subpixel at low current density is greater than a change in color coordinates of the red subpixel at high current density. This means that the red subpixel has difficulty normally expressing a red color at low current density.

SUMMARY OF THE DISCLOSURE

Accordingly, the present disclosure is directed to a light emitting display device that substantially obviates one or more problems due to limitations and disadvantages of the related art.

It is an object of the present disclosure to provide a light emitting display device configured such that an auxiliary conversion layer is provided in a non-emission portion of a subpixel, whereby luminous efficacy is improved and current-density-specific color purity is equalized, and therefore image quality is improved.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

In a light emitting display device according to the present disclosure, an auxiliary conversion layer is provided in a non-emission portion, whereby luminous efficacy is improved and current-density-specific color purity is equalized, and therefore image quality is improved.

To achieve these objects and other advantages and in accordance with the purpose of the disclosure, as embodied and broadly described herein, a light emitting display device includes a substrate including a first subpixel, a second subpixel, a third subpixel, and a fourth subpixel, each having an emission portion and a non-emission portion surrounding the emission portion, a red conversion layer, a green conversion layer, and a blue conversion layer provided on the substrate so as to correspond respectively to the emission portions of the first subpixel, the second subpixel, and the third subpixel, a first auxiliary conversion portion configured such that a first auxiliary conversion layer configured to transmit red light and a second auxiliary conversion layer configured to transmit light having a wavelength shorter than the wavelength of the red light are stacked in the non-emission portion of the first subpixel, a planarization layer configured to cover the red conversion layer, the green conversion layer, the blue conversion layer, and the first auxiliary conversion portion, and a light emitting element provided over the first to fourth subpixels on the planarization layer, the light emitting element including a first electrode and a second electrode opposite each other, a first stack including a first blue emission layer, a second stack including a red emission layer and a green emission layer, and a first charge generation layer between the first and second stacks, the first stack, the second stack, and the first charge generation layer being located between the first electrode and the second electrode.

In another embodiment, a light emitting display device comprises: a plurality of pixels, each of the pixels including a first subpixel, a second subpixel, a third subpixel, and a fourth subpixel, each of the first, second, third, and fourth subpixels having an emission portion and a non-emission portion surrounding the emission portion; a first color conversion layer, a second color conversion layer, and a third color conversion layer corresponding to the emission portion of the first subpixel, the second subpixel, and the third subpixel, respectively; and a first auxiliary conversion portion disposed on the non-emission portion of the first subpixel, the first auxiliary conversion portion including a first auxiliary conversion layer to transmit the first color light and a second auxiliary conversion layer to transmit light of a different color from the first color light.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF THE DISCLOSURE

Figure 1:
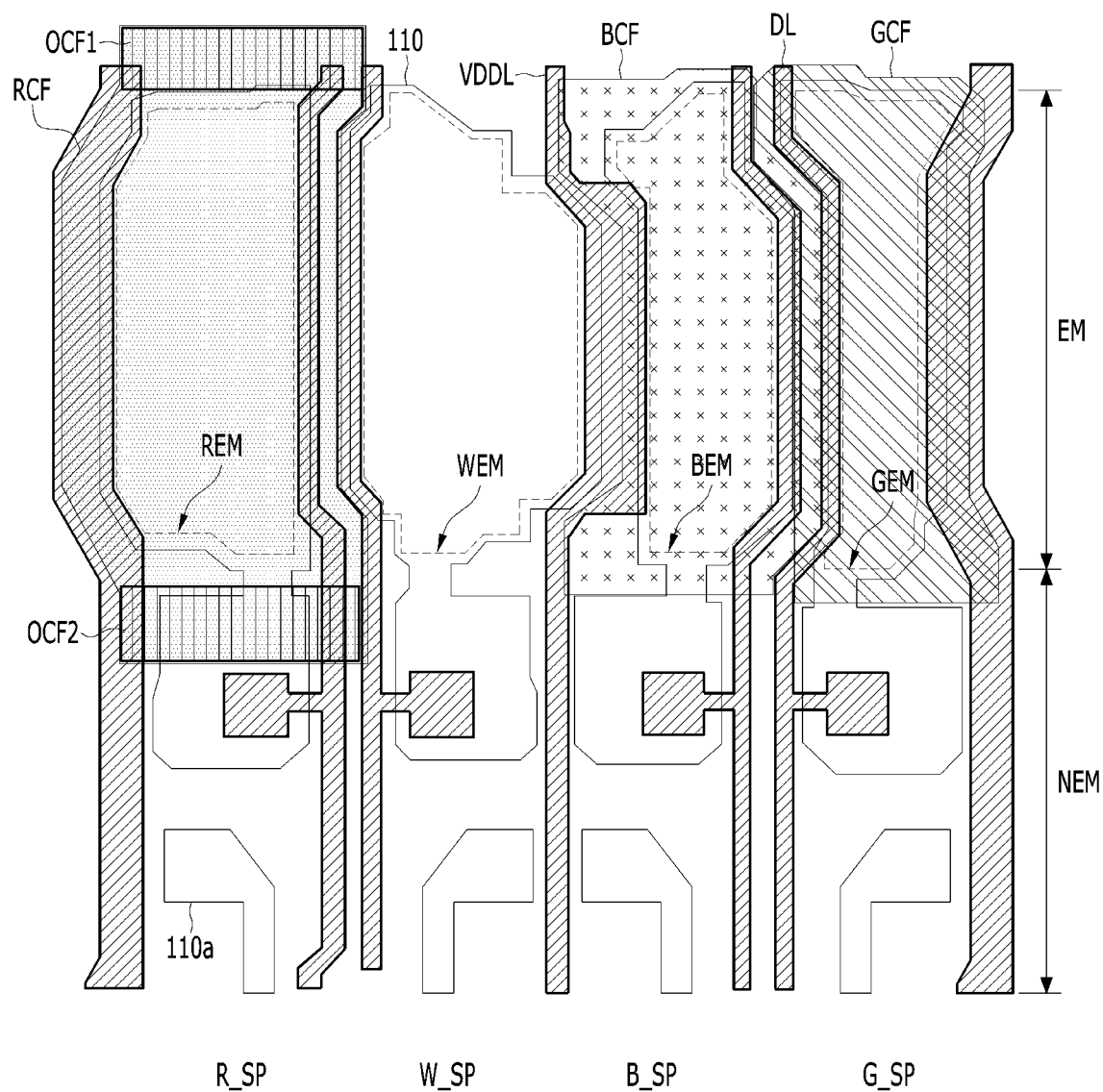
FIG. 1 is a plan view of a light emitting display device according to a first embodiment of the present disclosure.

Reference will now be made in detail to preferred embodiments of the present invention, examples of which are illustrated in the accompanying drawings. Wherever possible, the same reference numbers will be used throughout the drawings to refer to the same or like parts. In the following description of the present invention, detailed descriptions of known functions and configurations incorporated herein will be omitted when the same may obscure the subject matter of the present invention. In addition, the names of elements used in the following description are selected in consideration of clarity of description of the specification, and may differ from the names of elements of actual products.

The shape, size, ratio, angle, number, and the like shown in the drawings to illustrate various embodiments of the present invention are merely provided for illustration, and the invention is not limited to the content shown in the drawings. Wherever possible, the same reference numbers will be used throughout the drawings to refer to the same or like parts. In the following description, detailed descriptions of technologies or configurations related to the present invention may be omitted so as to avoid unnecessarily obscuring the subject matter of the present invention. When terms such as "including", "having", and "comprising" are used throughout the specification, an additional component may be present, unless "only" is used. A component described in a singular form encompasses a plurality thereof unless particularly stated otherwise.

The components included in the embodiments of the present invention should be interpreted to include an error range, even if there is no additional particular description thereof.

In describing the variety of embodiments of the present invention, when terms describing positional relationships such as "on", "above", "under" and "next to" are used, at least one intervening element may be present between the two elements, unless "immediately" or "directly" is used.

In describing the variety of embodiments of the present invention, when terms related to temporal relationships, such as "after", "subsequently", "next" and "before", are used, the non-continuous case may be included, unless "immediately" or "directly" is used.

In describing the variety of embodiments of the present invention, terms such as "first" and "second" may be used to describe a variety of components, but these terms only aim to distinguish the same or similar components from one another. Accordingly, throughout the specification, a "first" component may be the same as a "second" component within the technical concept of the present invention, unless specifically mentioned otherwise.

Features of various embodiments of the present disclosure may be partially or completely coupled to or combined with each other, and may be variously inter-operated with each other and driven technically. The embodiments of the present disclosure may be carried out independently from each other, or may be carried out together in an interrelated manner.

As used herein, the term "doped" means that, in a material that accounts for most of the weight of a layer, a material (for example, N-type and P-type materials, or organic and inorganic substances) having physical properties different from the material that occupies most of the weight ratio of the layer is added in an amount less than 30% by weight. In other words, the "doped" layer refers to a layer that is used to distinguish a host material from a dopant material of a certain layer, in consideration of the specific gravity of the weight ratio. Also, the term "undoped" refers to any case other than the "doped" case. For example, when a layer contains a single material or a mixture of materials having the same properties as each other, the layer is included in the "undoped" layer. For example, if at least one of the materials constituting a certain layer is p-type and not all materials constituting the layer are n-type, the layer is included in the "undoped" layer. For example, if at least one of materials constituting a layer is an organic material and not all materials constituting the layer are inorganic materials, the layer is included in the "undoped" layer. For example, when all materials constituting a certain layer are organic materials, at least one of the materials constituting the layer is n-type and the other is p-type, when the n-type material is present in an amount of less than 30 wt %, or when the p-type material is present in an amount of less than 30 wt %, the layer is included in the "doped" layer.

In the following description of the aspects, an electroluminescence (EL) spectrum is calculated by multiplying (1) a photoluminescence (PL) spectrum, in which unique characteristics of a luminescent material, such as a dopant material or a host material included in an organic light emitting layer, are reflected, by (2) an out-coupling emittance spectrum curve, determined according to the structure and optical characteristics of an organic light emitting device including thicknesses of organic layers, such as an electron transport layer, etc.

Hereinafter, a light emitting device of the present invention and a light emitting display including the same will be described with reference to the drawings.

Figure 2:
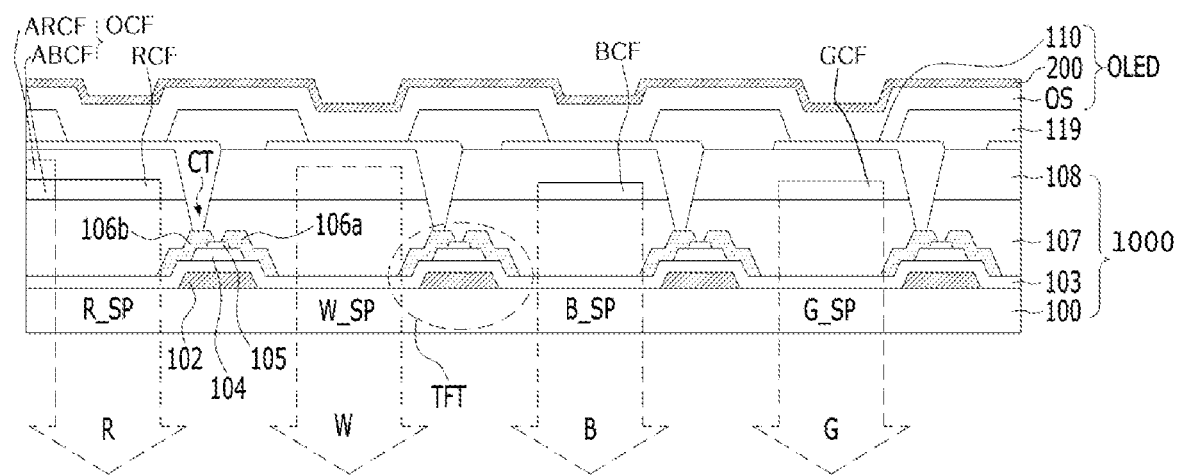
FIG. 2 is a sectional view of the light emitting display device according to the first embodiment of the present disclosure.

FIG. 1 is a plan view of a light emitting display device according to a first embodiment of the present disclosure, and FIG. 2 is a sectional view of the light emitting display device according to the first embodiment of the present disclosure.

As shown in FIGS. 1 and 2, the light emitting display device according to the first embodiment of the present disclosure includes a substrate 100 including a first subpixel R_SP, a second subpixel G_SP, a third subpixel B_SP, and a fourth subpixel W_SP, each of which has an emission portion EM and a non-emission portion NEM surrounding the emission portion EM, a red conversion layer RCF, a green conversion layer GCF, and a blue conversion layer BCF provided on the substrate so as to correspond respectively to the emission portions REM, GEM, and BEM, respectively, of the first subpixel R_SP, the second subpixel G_SP, and the third subpixel B_SP, a first auxiliary conversion portion OCF1 and OCF2 configured such that a first auxiliary conversion layer RCF configured to transmit red light and a second auxiliary conversion layer BCF configured to transmit light having a wavelength shorter than the wavelength of the red light are stacked in the non-emission portion NEM of the first subpixel R_SP, a planarization layer 108 configured to cover the red conversion layer RCF, the green conversion layer GCF, the blue conversion layer BCF, and the first auxiliary conversion portion OCF1 and OCF2, and a light emitting element OLED provided at each of the first to fourth subpixels R_SP, G_SP, B_SP, and W_SP on the planarization layer.

Here, the light emitting element OLED includes a first electrode 110 and a second electrode 200 opposite each other and an organic stack OS between the first electrode 110 and the second electrode 200, the organic stack OS having a plurality of stacks. As the minimum configuration, the organic stack OS may include a first stack S1 including a first blue emission layer BEML1 (see FIG. 6), a second stack S2 including a red emission layer 141 (see FIG. 6) and a green emission layer 143 (see FIG. 6), and a first charge generation layer 150 (see FIG. 6) between the first and second stacks.

The first electrode 110 is divided such that the light emitting element OLED independently functions in each of the subpixels R_SP, G_SP, B_SP, and W_SP. In a tandem element, the other components of the light emitting element OLED, i.e., the organic stack OS and the second electrode 200, may be continuously formed on the plane of the subpixels R_SP, G_SP, B_SP, and W_SP. In forming the organic stack OS and the second electrode 200, therefore, a process may be performed without a metal mask requiring a micro-opening, and therefore it is possible to solve a problem due to drooping of the metal mask or burden required to manufacture the metal mask.

FIG. 1 shows the first to fourth subpixels R_SP, G_SP, B_SP, and W_SP, which emit different colors of light, among a plurality of subpixels provided in the substrate 100. The first to fourth subpixels R_SP, G_SP, B_SP, and W_SP may be repeatedly arranged in the substrate 100. In the example shown, the first to fourth subpixels R_SP, G_SP, B_SP, and W_SP are arranged in a stripe pattern; however, the present disclosure is not limited thereto. For example, the first and second subpixels may be arranged on one column, and the third and fourth subpixels may be arranged on another column. That is, four subpixels that emit different colors of light may be divided into two parts such that every two subpixels are arranged side by side in a horizontal or vertical direction. Alternatively, the subpixels may be disposed in a diamond-shaped pattern.

In FIG. 1, the first subpixel R_SP, the fourth subpixel W_SP, the third subpixel B_SP, and the second subpixel G_SP are sequentially arranged from the left side. For the sake of description, only vertical wires that divide the subpixels are shown, and the other wires are omitted.

The subpixels may be deformed by the shapes of the wires that intersect each other. In addition, the subpixels may have different shapes depending on the optimum emission efficiency required by the device. In FIG. 1, the first to fourth subpixels R_SP, G_SP, B_SP, and W_SP are shown as having different shapes; however, the present disclosure is not limited thereto. The subpixels may have the same size and area. In FIG. 1, four adjacent subpixels are shown as being arranged in an approximately stripe pattern, wherein horizontal wires are omitted. A data line DL that supplies data voltage to each subpixel is provided, and a driving supply voltage line VDDL that supplies a driving supply voltage signal to two adjacent subpixels is provided. A scan line that applies a row-specific scan signal may be provided so as to intersect the data line DL and the driving supply voltage line VDDL, and a source electrode (a drain electrode) protruding from each data line DL and a switching transistor that determines turn-on of each subpixel may be further provided at the intersection. A driving transistor is provided at each subpixel so as to be connected to the driving supply voltage line VDDL. The transistor (TFT) shown in FIG. 2 may be a driving transistor. In FIG. 1, two data lines are disposed between the first and fourth subpixels R_SP and W_SP, and two data lines are disposed between the second and third subpixels G_SP and B_SP, whereby data voltage is supplied to opposite subpixels. However, the present disclosure is not limited thereto, and the data line may be provided at the same position so as to correspond to each subpixel.

The light emitting element OLED provided at the first to fourth subpixels R_SP, G_SP, B_SP, and W_SP emits white light outside, and the red conversion layer RCF, the green conversion layer GCF, and the blue conversion layer BCF are provided at the emission portion EM of the first to third subpixels R_SP, G_SP, and B_SP to express colors of the subpixels. The fourth subpixel S_WP is provided with no color conversion layers, whereby it is possible to emit light generated in the light emitting element OLED outside without change.

The emission direction of light from the organic stack OS may be changed depending on reflectance and transmittance of the first and second electrodes 110 and 200. For example, when the first electrode 110 is transmissive and the second electrode 200 is reflective, light may be emitted outside in a downward direction, as shown in FIG. 2.

When the first electrode 110 is reflective and the second electrode 200 is transmissive, light may be transmitted in an upward direction. When one of the first and second electrodes 110 and 200 is transmissive and the other is transmissive or semi-transmissive, light may be transmitted in opposite directions. One of the first electrode 110 and the second electrode 200 may be a transparent oxide alloy, such as ITO, IZO, or ITZO, and the other may be metal or a metal alloy including at least one of silver (Ag), magnesium (Mg), aluminum (Al), ytterbium (Yb), and strontium (Sr).

When the light emitting display device is a bottom emission type display device or a transparent display device, provision of a circuit, such as wires and transistors, at a region corresponding to an outward emission side is avoided. In FIG. 1, therefore, the emission portions REM, WEM, BEM, and GEM of the subpixels have different shapes through avoidance of wires and transistors.

The red conversion layer RCF, the green conversion layer GCF, and the blue conversion layer BCF are color filters that respectively transmit only red light, green light, and blue light, each of which is a part of light having a wide spectrum, such as the visible spectrum. The red conversion layer RCF may transmit red light and may block green light and blue light. The green conversion layer GCF may transmit green light and may block red light and blue light. The blue conversion layer BCF may transmit blue light and may block red light and green light. Each of the red conversion layer RCF, the green conversion layer GCF, and the blue conversion layer BCF may include a pigment or a dye in order to perform a function of selectively transmitting light.

In the light emitting display device according to the first embodiment of the present disclosure, the first auxiliary conversion portion OCF1 and OCF2 is provided in the non-emission portion of the first subpixel R_SP, and the first auxiliary conversion portion OCF1 and OCF2 may be provided along an upper contour line and a lower contour line in a state of being adjacent to upper and lower boundaries of the red emission portion REM. The first auxiliary conversion portion OCF1 and OCF2 is formed by stacking a plurality of color conversion layers. As shown in FIG. 2, the first auxiliary conversion portion OCF1 and OCF2 may include a first auxiliary conversion layer ARCF identical to the red conversion layer RCF provided in the emission portion EM of the first subpixel R_SP, in which the first auxiliary conversion portion OCF1 and OCF2 is formed, and a second auxiliary conversion layer ABCF configured to transmit a color different from the first auxiliary conversion layer ARCF.

The reason that the first auxiliary conversion portion OCF1 and OCF2 is provided around the red emission portion REM is that it is necessary to adjust color purity of light emitted from the red emission portion REM so as to be uniform irrespective of current density. That is, the first auxiliary conversion portion OCF1 and OCF2 provided around the red emission portion REM blocks light emitted from the vicinity of the red emission portion REM using a selective transmission function thereof, thereby preventing emission of different color light from the red emission portion REM.

In the light emitting element OLED, particularly the organic stack OS, which emits light, is commonly provided in all the subpixels. Light emission may be radially performed through resonance and reflection between the first and second electrodes 110 and 200 as well as in an upward-downward direction, and may affect the emission portion EM adjacent thereto while advancing to a luminosity side of the non-emission portion NEM. In a structure in which the color conversion layers are provided at only the emission portion, particularly in the red emission portion REM, color purity is lowered when driven at low current density. Consequently, the light emitting display device according to the present disclosure includes the first auxiliary conversion portion OCF1 and OCF2 in order to block light other than red light at the red emission portion REM.

Here, the first auxiliary conversion portion OCF1 and OCF2 includes the second auxiliary conversion layer ABCF that transmits other color light in addition to the first auxiliary conversion layer ARCF that selectively transmits red light in consideration of a function of blocking other color light, rather than a transmission function of the second auxiliary conversion layer ABCF. As the result of stacking of the first and second auxiliary conversion layers ARCF and ABCF, color filter functions performed by the first and second auxiliary conversion layers ARCF and ABCF are enhanced. As an example, there is a great transmitted light area difference between the first auxiliary conversion layer ARCF and the second auxiliary conversion layer ABCF. It is preferable for the second auxiliary conversion layer ABCF to transmit light having a shorter wavelength of 100 nm to 220 nm than the transmission area of the first auxiliary conversion layer ARCF. In this case, the second auxiliary conversion layer ABCF may be made of the same material as the blue conversion layer BCF provided in the blue emission portion BEM. At this time, as the result of double stacking of the first and second auxiliary conversion layers ARCF and ABCF, green light that is relatively strongly emitted from the light emitting element OLED may be doubly blocked, whereby it is possible to prevent color purity of the red emission portion from being affected by side leakage of the strong green light. Depending on circumstances, the first auxiliary conversion portion OCF1 and OCF2 may further include a third auxiliary conversion layer AGCF configured to transmit green light, wherein the third auxiliary conversion layer AGCF may overlap the first and second auxiliary conversion layers ARCF and ABCF. In this case, the same effect of blocking leakage light may be achieved.

A bank 119 is further provided in the non-emission portion NEM of the first to fourth subpixels R_SP, G_SP, B_SP, and W_SP. Since the first auxiliary conversion portion OCF1 and OCF2 is provided in the non-emission portion, the bank 119 overlaps the first auxiliary conversion portion OCF1 and OCF2. Since the first auxiliary conversion portion OCF1 and OCF2 is constituted by stacking a plurality of color conversion layers, transmittance is reduced when provided in the emission portion. For this reason, the first auxiliary conversion portion OCF1 and OCF2 is provided outside the red emission portion REM.

In addition, as shown in FIG. 2, a thin film transistor TFT is further included in the non-emission portion NEM of each of the first to fourth subpixels. In at least the first subpixel R_SP, which emits red light, the first auxiliary conversion portion OCF1 and OCF2 is located so as not to overlap the thin film transistor, whereby it is possible to prevent lowering in color purity of red light due to side leakage light in the area of the non-emission portion NEM in which the thin film transistor TFT is not located and to achieve red light emission display having uniform color characteristics irrespective of current density.

Meanwhile, reference symbol 110a is a first electrode dummy pattern, which is formed on the same layer as the first electrode 110. The first electrode dummy pattern may be used as a connection means between the second electrode 200 and an auxiliary wire (not shown) or may be used in another circuit disposed in a storage capacitor or the non-emission portion. Depending on circumstances, the first electrode dummy pattern 110*a* may be omitted.

As an example, the thin film transistor TFT of FIG. 2 includes a gate electrode 102, a semiconductor layer 104, and a source electrode 106*a* and a drain electrode 106*b* connected to opposite sides of the semiconductor layer 104 on the substrate 100.

A gate dielectric film 103 is provided between the gate electrode 102 and the semiconductor layer 104.

For example, the semiconductor layer 104 may be made of amorphous silicon, polycrystalline silicon, an oxide semiconductor, or a combination of two or more thereof. For example, when the semiconductor layer 104 is an oxide semiconductor, an etch stopper 105 may be further provided on the semiconductor layer 104 in a directly abutting state in order to prevent damage to a channel area of the semiconductor layer 104.

Depending on circumstances, the gate electrode 102, the source electrode 106*a*, and the drain electrode 106*b* may be provided on the same layer.

In addition, the drain electrode 106*b* of the thin film transistor TFT may be connected to the first electrode 110 through a contact hole CT formed in a passivation film 107 and the planarization layer 108.

The passivation film 107 is provided in order to primarily protect the thin film transistor TFT, and the color conversion layers RCF, GCF, and BCF may be provided on the passivation film so as to correspond to the emission portions REM, GEM, and BEM, respectively.

The red conversion layer RCF, the green conversion layer GCF, and the blue conversion layer BCF are provided respectively in the other subpixels R_SP, G_SP, and B_SP, excluding the fourth subpixel W_SP, to allow light components having corresponding wavelengths of white light that has passed through the first electrode 110 to pass therethrough.

Light from the light emitting element OLED is emitted downwards through the substrate 100 via the first electrode 110, the planarization layer 108, the color conversion layers RCF, GCF, and BCF, the passivation film 107, and the gate dielectric film 103 in the first to third subpixels R_SP, G_SP, and B_SP. In the fourth subpixel W_SP, light does not pass through the color conversion layers, among the films through which light passes, the light may be emitted outside while maintaining wide wavelength characteristics of the white spectrum.

Meanwhile, the first auxiliary conversion portion OCF1 and OCF2 provided in the non-emission portion of the first subpixel R_SP is not directly used for bottom emission but serves to block side leakage light transmitted to the red emission portion REM.

Here, An open area between the banks 119 corresponds to the emission portions REM, GEM, BEM, and WEM of the subpixels.

Hereinafter, a light emitting display device according to a second embodiment of the present disclosure will be described.

Figure 3:
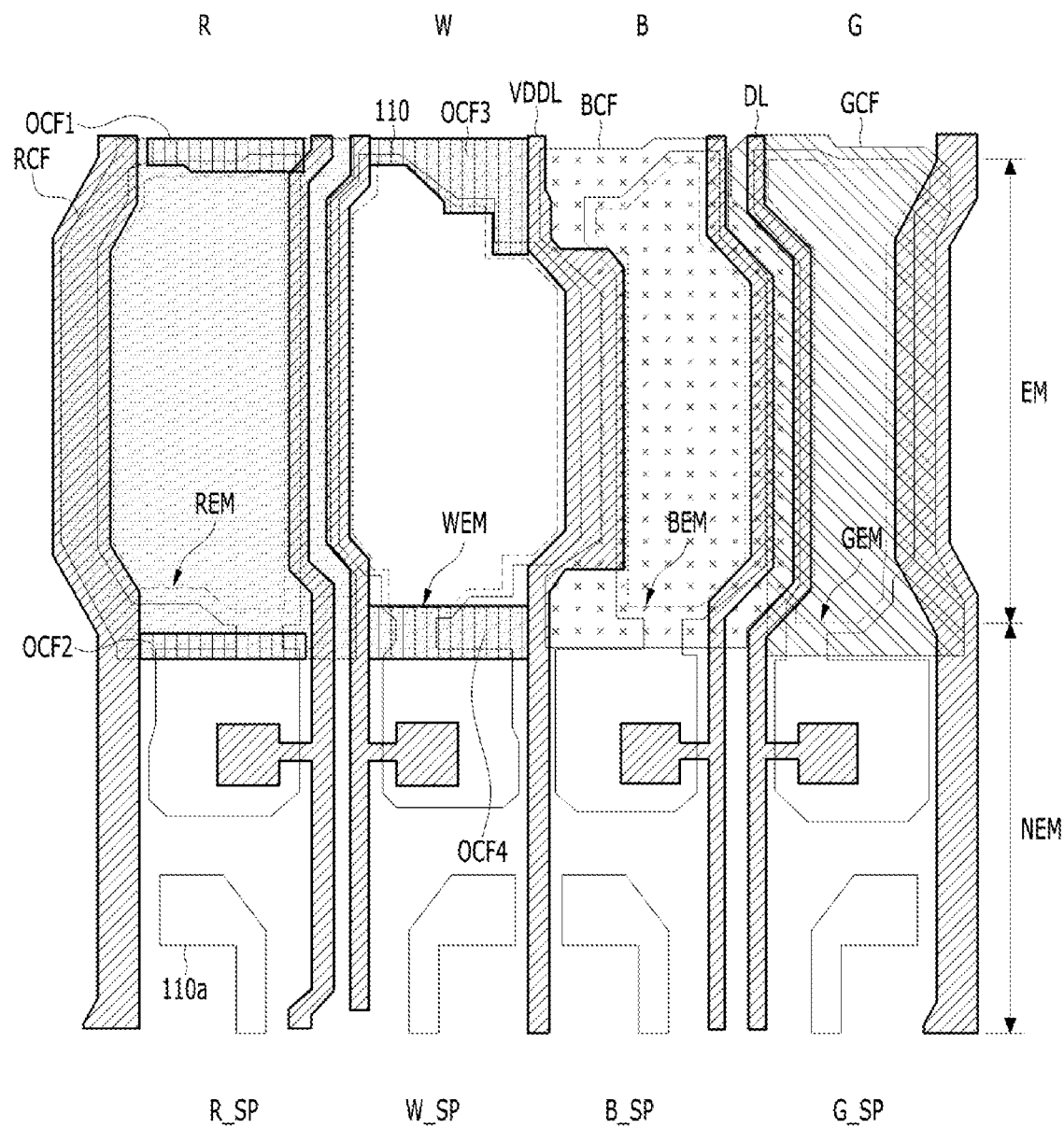
FIG. 3 is a plan view of a light emitting display device according to a second embodiment of the present disclosure.
Figure 4:
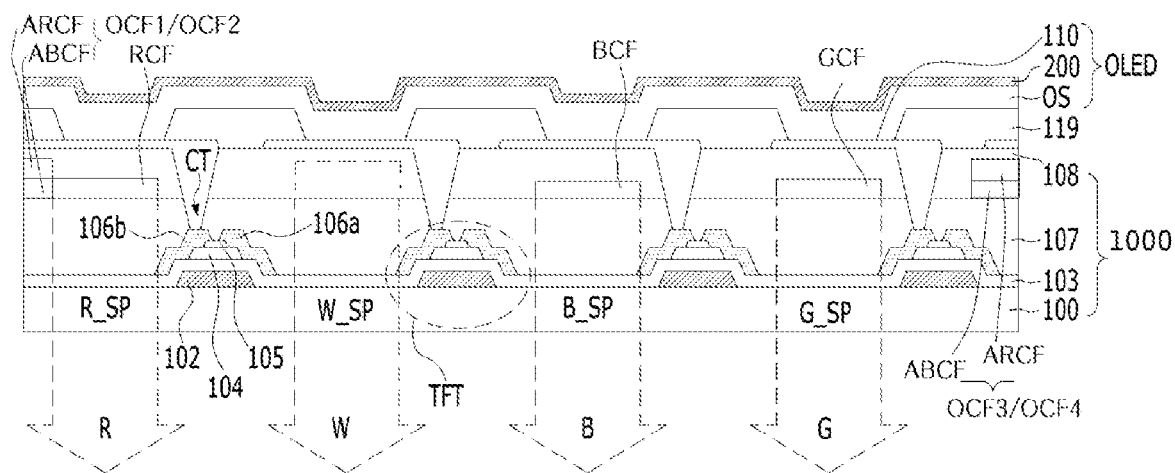
FIG. 4 is a sectional view of the light emitting display device according to the second embodiment of the present disclosure.

FIG. 3 is a plan view of a light emitting display device according to a second embodiment of the present disclosure, and FIG. 4 is a sectional view of the light emitting display device according to the second embodiment of the present disclosure.

As shown in FIGS. 3 and 4, the light emitting display device according to the second embodiment of the present disclosure is different from the first embodiment in that a second auxiliary conversion portion OCF3 and OCF4 is further provided in the non-emission portion around the white emission portion WEM of the fourth subpixel W_SP.

As shown in FIG. 4, the second auxiliary conversion portion OCF3 and OCF4 includes a first auxiliary conversion layer ARCF configured to selectively transmit red light and a second auxiliary conversion layer ABCF configured to selectively transmit color light different from red light. The second auxiliary conversion layer ABCF is provided in consideration of a function of blocking other color light, rather than a transmission function of the second auxiliary conversion layer ABCF. As the result of stacking of the first and second auxiliary conversion layers ARCF and ABCF, color filter functions performed by the first and second auxiliary conversion layers ARCF and ABCF are enhanced. As an example, there is a great transmitted light area difference between the first auxiliary conversion layer ARCF and the second auxiliary conversion layer ABCF. It is preferable for the second auxiliary conversion layer ABCF to transmit light having a shorter wavelength of 100 nm to 220 nm than the transmission area of the first auxiliary conversion layer ARCF. In this case, the second auxiliary conversion layer ABCF may be made of the same material as the blue conversion layer BCF provided in the blue emission portion BEM. At this time, as a result of double stacking of the first and second auxiliary conversion layers ARCF and ABCF, the first and second auxiliary conversion portion OCF1 and OCF2/OCF3 and OCF4 may doubly block green light that is relatively strongly emitted from the light emitting element OLED, whereby it is possible to prevent color purity of the red emission portion from being affected by side leakage of the strong green light.

Since no color conversion layers are disposed in the white emission portion WEM, the second auxiliary conversion portion OCF3 and OCF4 provided above and under the white emission portion WEM of the fourth subpixel W_SP has no color conversion layers therein, unlike the first auxiliary conversion portion OCF1 and OCF2 neighboring the red conversion layer RCF of the red emission portion REM.

Since the area of the red emission portion REM and the white emission portion WEM may be changed as needed, the first auxiliary conversion portion OCF1 and OCF2 provided at upper and lower contour boundary lines of the red emission portion REM and the second auxiliary conversion portion OCF3 and OCF4 provided at upper and lower contour boundary lines of the white emission portion WEM may have different widths.

Meanwhile, in both the first embodiment and the second embodiment, the green conversion layer GCF and the blue conversion layer BCF may be extended and stacked on areas corresponding to vertical boundary parts of the second subpixel G_SP and the third subpixel B_SP, whereby an auxiliary conversion portion may be provided at vertical contour parts of the emission portions GEM and BEM of the second and third subpixels G_SP and B_SP. In this case, the green conversion layer GCF and the blue conversion layer BCF, which overlap each other, may have a light leakage blocking effect in the non-emission portion.

A description of the same construction of the second embodiment as the first embodiment will be omitted. Hereinafter, the specific construction of the light emitting element in the light emitting display device according to the present disclosure and the meaning of the auxiliary conversion portion in the light emitting element will be described.

Figure 5:
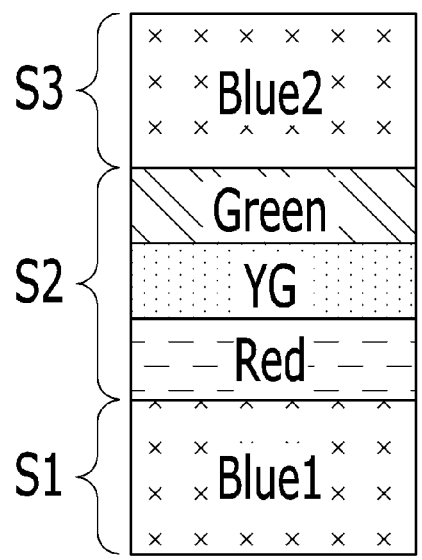
FIG. 5 is a sectional view schematically showing a light emitting element of the light emitting display device according to the present disclosure.
Figure 6:
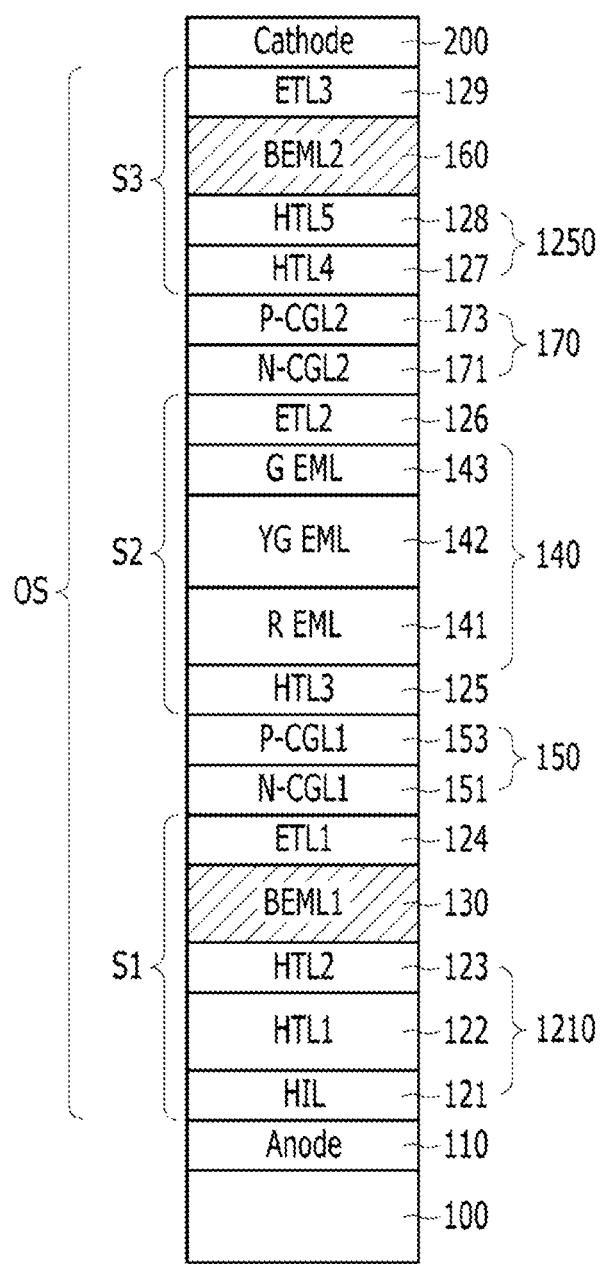
FIG. 6 is a sectional view specifically showing a stack structure of the light emitting element of the light emitting display device according to the present disclosure.

FIG. 5 is a sectional view schematically showing the light emitting element of the light emitting display device according to the present disclosure, and FIG. 6 is a sectional view specifically showing a stack structure of the light emitting element of the light emitting display device according to the present disclosure.

In FIG. 5, the organic stack OS of the light emitting element of FIG. 2 is shown as including three stacks S1, S2, and S3, and the stacks are shown as including emission layers.

As shown in FIG. 5, the first stack S1 may include a first blue emission layer Blue1, the second stack S2 may include a plurality of adjacent emission layers Red, YG, and Green having longer wavelengths than the wavelength of the blue light, and the third stack S3 may include a second blue emission layer Blue2.

The reason that the organic stack includes two blue stacks is that it is necessary to improve efficiency of the blue light having low visibility. In the light emitting display device according to the present disclosure, the advantage obtained when the first and/or second auxiliary conversion portion is provided may also be equally applied to the case in which the first stack S1 and the second stack S2 are included.

Depending on circumstances, the light emitting display device according to the present disclosure may further include another stack in addition to the first to third stacks S1, S2, and S3.

The second stack S2 includes a red emission layer Red, a green emission layer Green, and a yellowish green emission layer YG between the red emission layer Red and the green emission layer Green in order to display various colors through a plurality of stacks.

In order for the organic stack to provide a white spectrum, the second stack S2 may include only the red emission layer Red and the yellowish green emission layer YG. Since high luminous efficacy is required by the light emitting display device, however, the green emission layer Green exhibiting a similar white spectrum and improving luminous efficacy is further included.

In the light emitting display device according to the present disclosure configured to have a structure in which the green emission layer Green is further included in addition to the red emission layer and the yellowish green emission layer, lowering in red purity of the first subpixel (red subpixel) at low current density due to high efficiency of the green emission layer Green is prevented by the first and/or second auxiliary conversion portion.

A plurality of stacks have different color emission layers or combinations thereof. Since at least the blue emission layer, among the color emission layers, has lower efficiency than other color emission layers, each of one or more stacks includes a single emission layer. In the other color emission layers other than the blue emission layer, a plurality of adjacent emission layers may be provided in order to improve overall luminance of the light emitting display device. The stack other than the blue stack may be constituted by a red emission layer and a yellowish green emission layer abutting each other or by a red emission layer, a yellowish green emission layer, and a green emission layer abutting each other.

As shown in FIG. 6, the first to third stacks S1, S2, and S3 are divided by first and second charge generation layers 150 and 170 between the first electrode 110 and the second electrode 200. In the first stack S1, a hole-related portion 1210, a first blue emission layer 130, and a first electron transport layer 124 may be sequentially stacked between the first electrode 110 and the first charge generation layer 150.

The hole-related portion 1210 may include a hole injection layer 121 configured to inject holes from the first electrode 110 and a first hole transport layer 122 and a second hole transport layer 123 configured to transport holes from the hole injection layer 121 to the first blue emission layer 130. The first and second hole transport layers 122 and 123 may be formed to have a two-layered structure, as shown, or may be formed as a single layer. In the two-layered structure, the first hole transport layer 122 has a hole transport function, and the second hole transport layer 123 has a hole transport function and a function of preventing transmission of electrons and excitons to the first hole transport layer 122.

The second stack S2 is provided between the first and second charge generation layers 150 and 170, and includes a hetero emission portion 140 including a red emission layer 141, a yellowish green emission layer 142, and a green emission layer 143 that are stacked while being adjacent to each other, a third hole transport layer 125 under the red emission layer 141, and a second electron transport layer 126 on the green emission layer 143.

The third stack S3 is provided between the second charge generation layer 170 and the second electrode 200, and a hole-related portion 1250, a second blue emission layer 160, and a third electron transport layer 129 may be sequentially stacked. The hole-related portion 1250 includes a fourth hole transport layer 127 configured to transport holes from the second charge generation layer 170 to the second blue emission layer 160 and a fifth hole transport layer 128 having a hole transport function and a function of preventing downward transmission of excitons and electrons of the second blue emission layer 160.

The first and second charge generation layers 150 and 170 between the stacks respectively include n-type charge generation layers 151 and 171 configured to generate electrons and to transfer the electrons to the stacks adjacent thereto and p-type charge generation layers 153 and 173 configured to generate holes and to transfer the holes to the stacks adjacent thereto. Depending on circumstances, the first and second charge generation layers 150 and 170 may be formed as a single layer by doping one or more hosts with an n-type dopant and a p-type dopant.

Hereinafter, color characteristics will be described while the configuration of a light emitting element is changed and current density is changed without application of an auxiliary conversion portion as a first experiment.

Figure 7A:
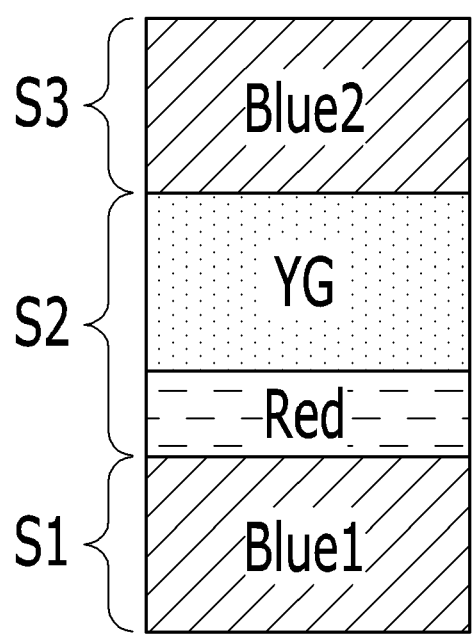
FIGS. 7A and 7B are sectional views respectively showing device A and device B.
Figure 7B:
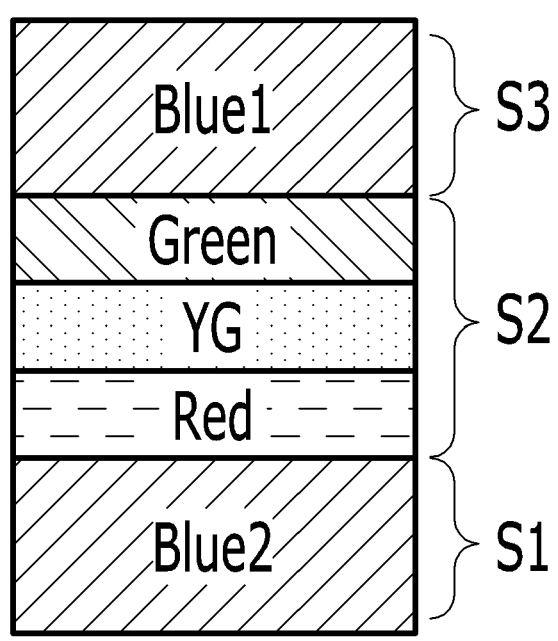
Figure 8:
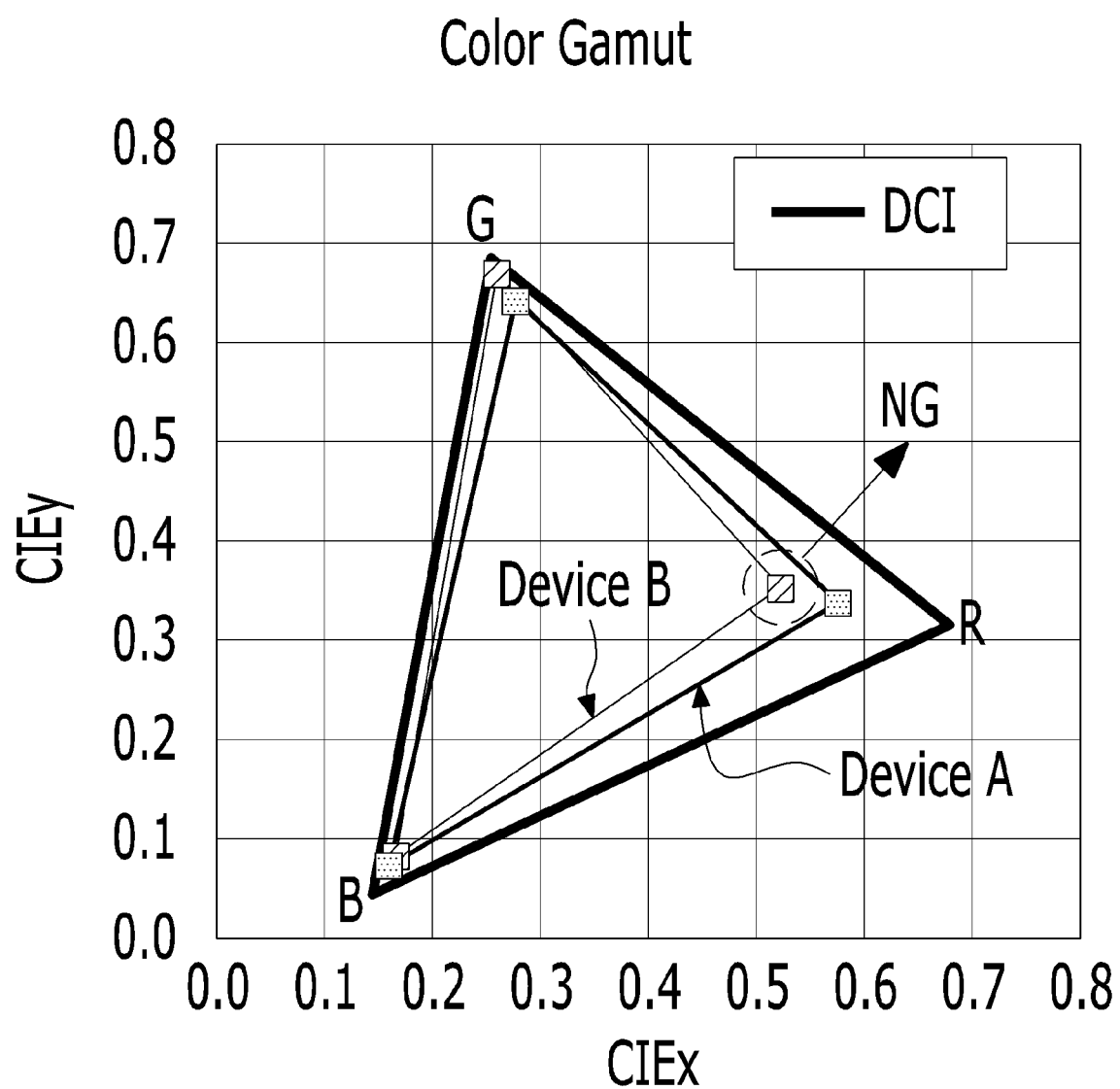
FIG. 8 is a graph showing a color gamut when device A and device B are driven at low current densities.
Figure 9A:
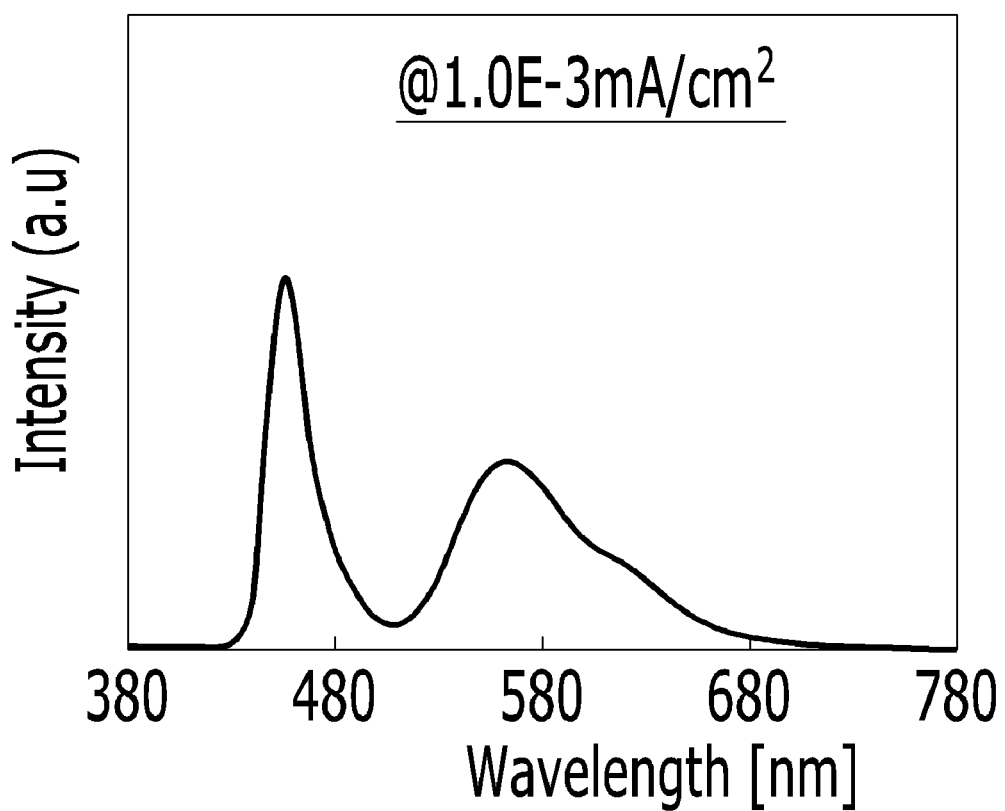
FIGS. 9A and 9B are graphs respectively showing intensity based on wavelength when device A is driven at low and high current densities.
Figure 9B:
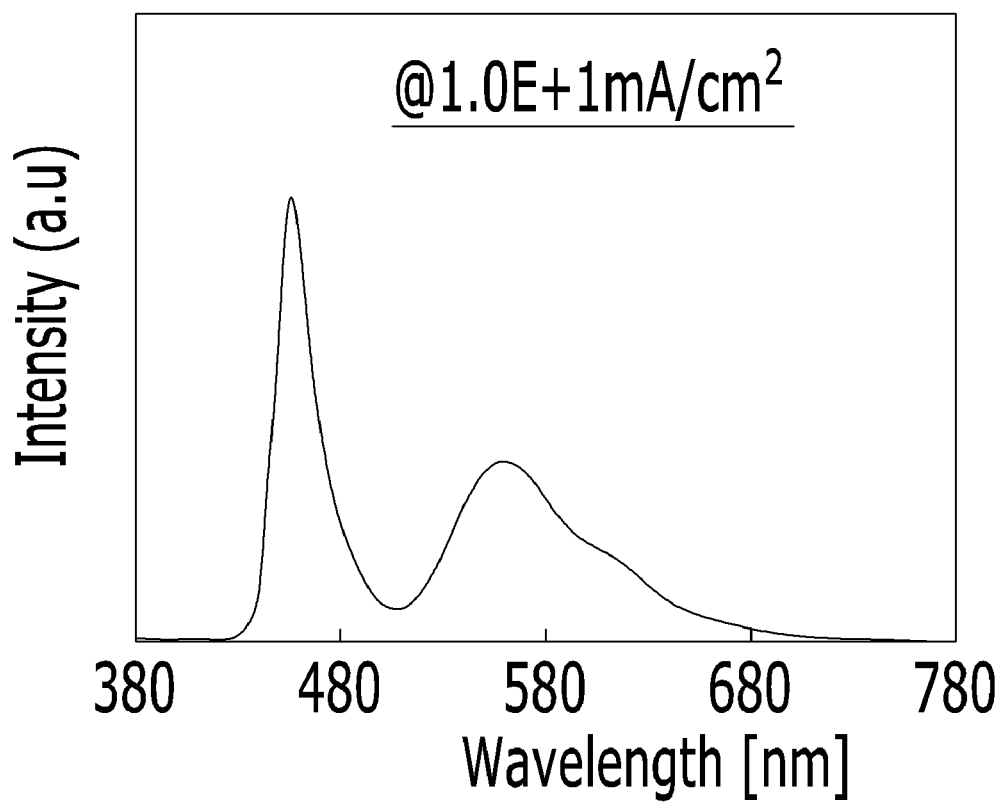
Figure 10A:
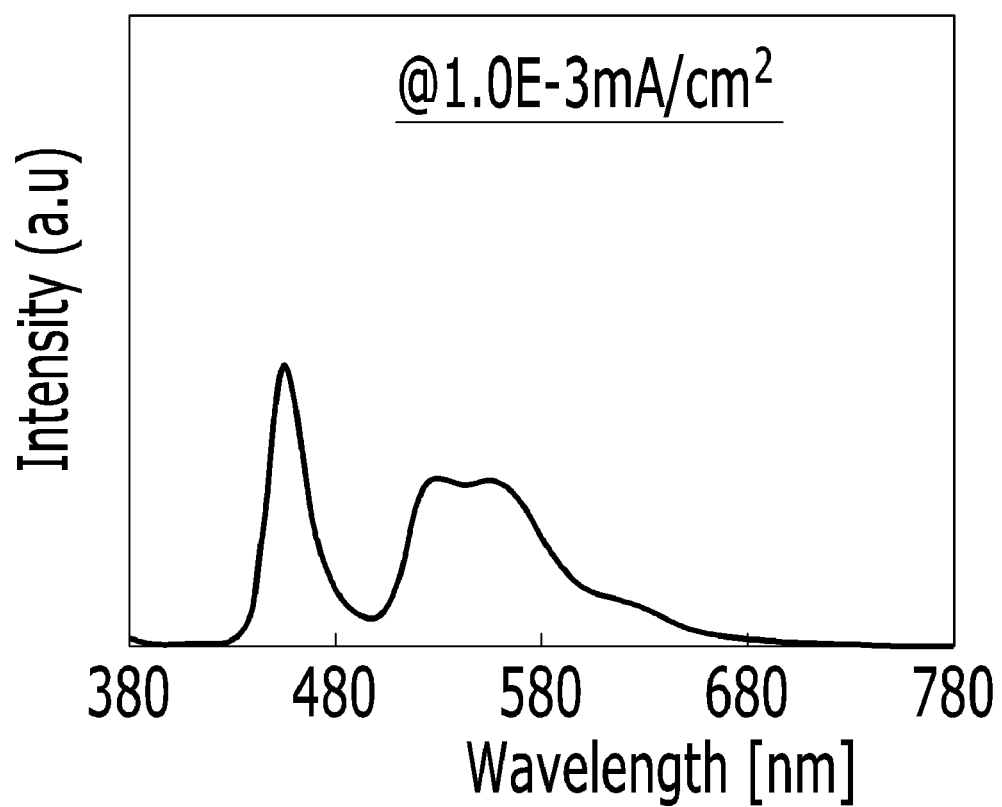
FIGS. 10A and 10B are graphs respectively showing intensity based on wavelength when device B is driven at low and high current densities.
Figure 10B:
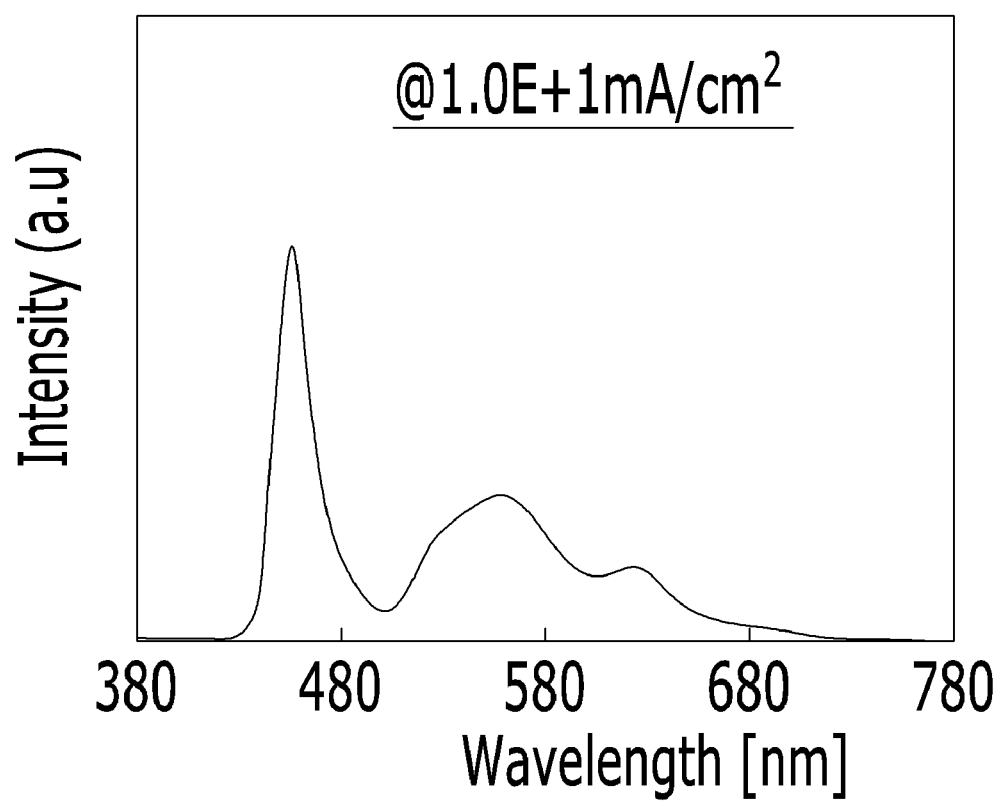
Figure 11:
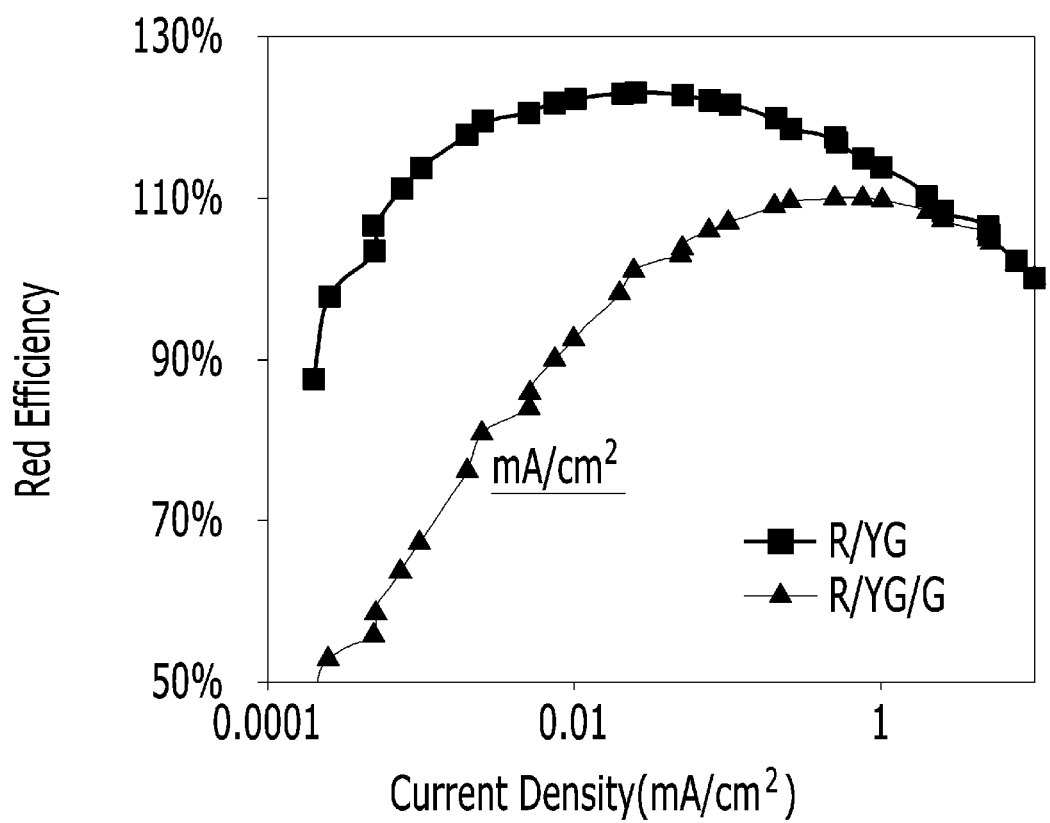
FIG. 11 is a graph showing current density-specific red intensity of device A and device B for comparison.

FIGS. 7A and 7B are sectional views respectively showing device A and device B. FIG. 8 is a graph showing a color gamut when device A and device B are driven at low current densities. FIGS. 9A and 9B are graphs respectively showing intensity based on wavelength when device A is driven at low and high current densities. FIGS. 10A and 10B are graphs respectively showing intensity based on wavelength when device B is driven at low and high current densities. FIG. 11 is a graph showing current density-specific red intensity of device A and device B for comparison.

FIGS. 7A and 7B respectively show device A and device B having different second stacks each having a hetero emission portion in the configuration of a light emitting element in a first experiment, wherein device B is configured to have a structure in which a red emission layer, a yellowish green emission layer, and a green emission layer are stacked in a hetero emission portion, in the same manner as in the light emitting element described with reference to FIG. 5, and device A is configured to have a structure in which only a red emission layer and a yellowish green emission layer are stacked, compared to device B.

As shown in FIG. 8, when describing color gamut in the case in which a color conversion layer is provided but no auxiliary conversion portion is provided under the emission portion of the subpixel of the light emitting element of device A and device B, it can be seen that blue gamut and green gamut of both device A and device B are similar to a DCI level but red gamut is greatly different from the DCI level. Particularly, in device B, red coordinates are more greatly different from the DCI level than in device A. The reason for this seems to be that device B uses a green emitting layer, which has high efficiency, and therefore red coordinates becomes close to white. White light emitted from the light emitting element is the sum of lights emitted from emission layers of the stacks. Among the emission layers provided in the organic stack, the emission layer having a greatest influence on luminance is the green emission layer Green, which has high efficiency. A transition phenomenon of red gamut means that purity in red expression of the light emitting display device is reduced, whereby a viewer recognizes image quality deterioration, which is a problem to be solved.

FIGS. 9A and 9B respectively show white spectra when device A is driven at low and high current densities, wherein similar shapes are exhibited irrespective of density change. It can be seen that, as the result of providing the red emission layer and the yellowish green emission layer in the hetero emission portion, yellowish green emission characteristics are uniformly exhibited when driven at low and high current densities.

In contrast, FIGS. 10A and 10B respectively show white spectra when device B is driven at low and high current densities, and it can be seen that, when driven at low current density, red emission intensity is decreased and green emission intensity is increased, compared to when driven at high current density.

When comparing red efficiencies of device A and device B with reference to FIG. 11, it can be seen that, when driven at a low current density of 1 mA/cm² or less, device B has lower efficiency than device A. This means that, in device B having the green emission layer further provided in the hetero emission portion in order to achieve higher efficiency than device A, red emission efficiency is abruptly reduced when driven at low current density.

In the light emitting display device according to the present disclosure, a problem in that red purity is reduced when driven at low current density is solved by providing the auxiliary conversion portion in the non-emission portion when the green emission layer is provided in the hetero emission portion in order to improve luminance of the display device.

Particularly, in the light emitting display device according to the present disclosure, the first auxiliary conversion portion is provided in the non-emission portion around the red emission portion in order to improve red purity, whereby an influence due to leakage light around the red emission portion is prevented. In addition, the second auxiliary conversion portion is provided in the non-emission portion around the white emission portion, whereby it is possible to further prevent an influence due to light leakage around the red emission portion.

In a second experiment, the meaning of the light emitting display device according to the present disclosure will be described through a change in configuration of the color conversion layer of the non-emission portion in the structure in which the red, yellowish green, and green emission layers are provided in the hetero emission portion of FIGS. 5, 6, and 7B.

Figure 12A:
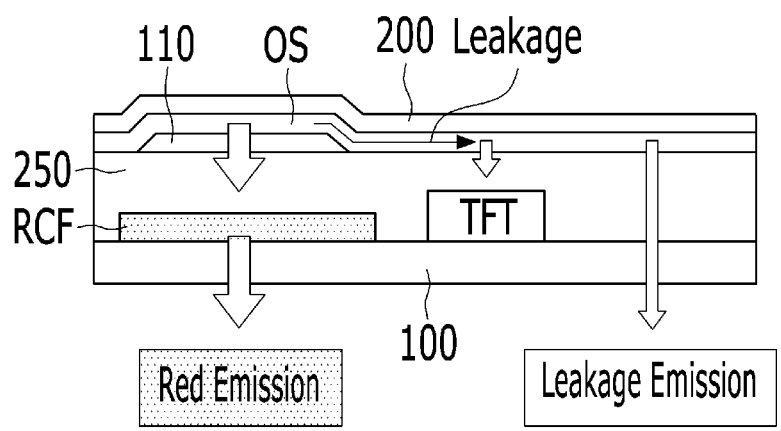
FIGS. 12A to 12F are sectional views of first to sixth experimental examples.
Figure 12B:
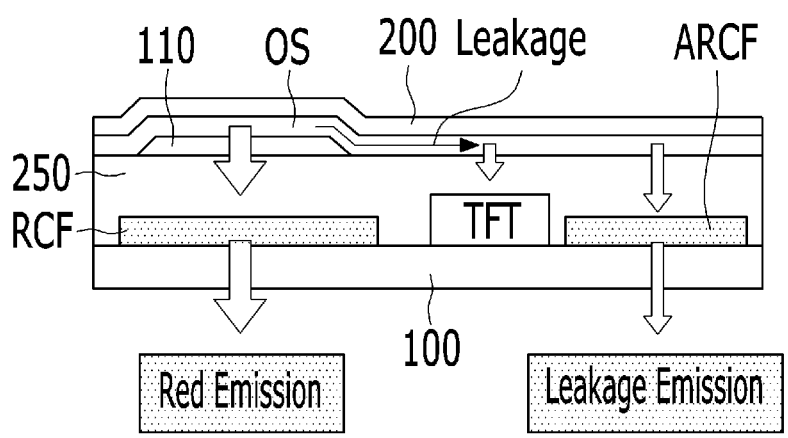
Figure 12C:
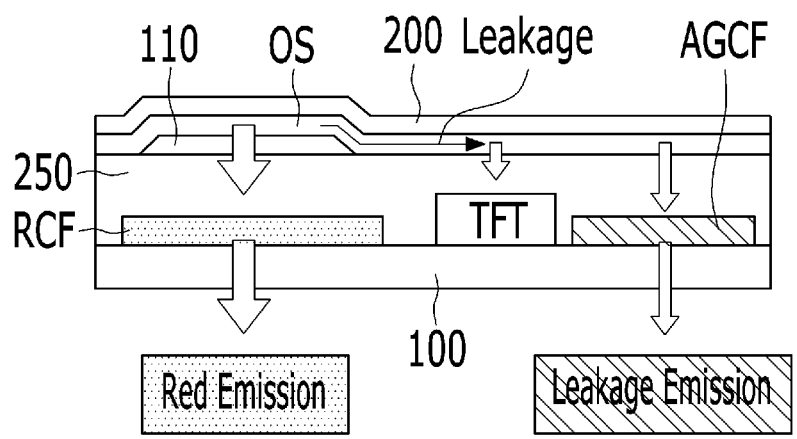
Figure 12D:
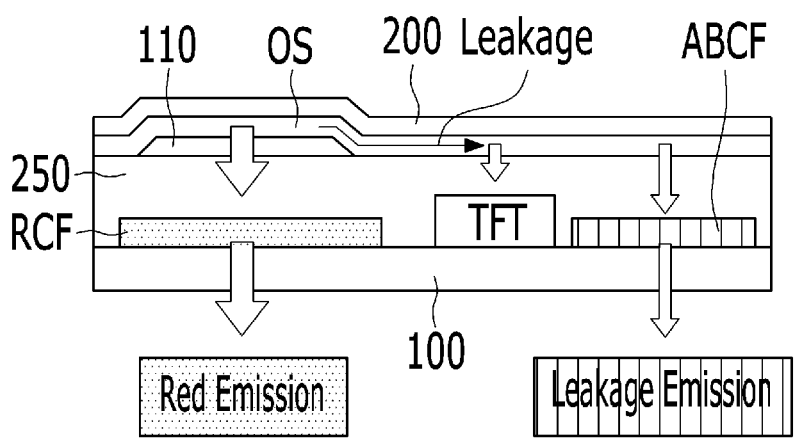
Figure 12E:
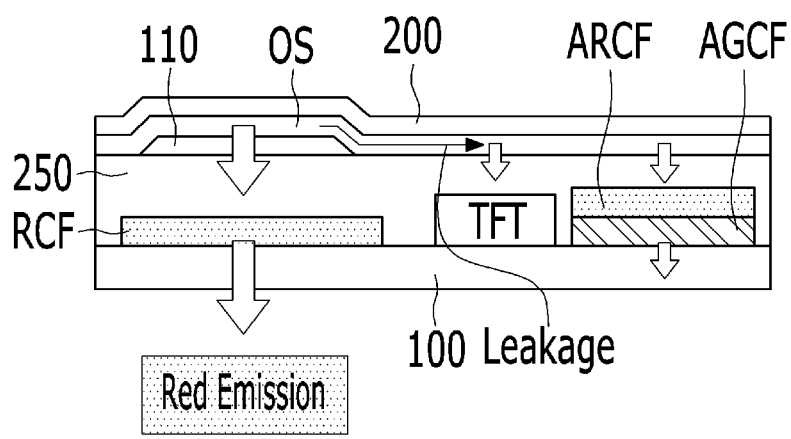
Figure 12F:
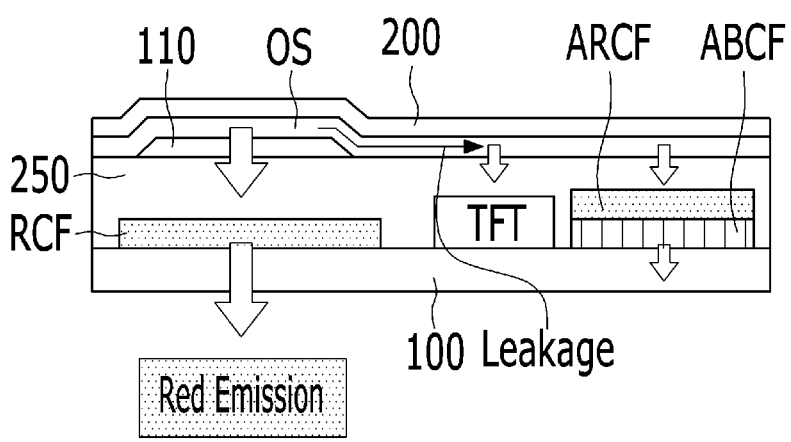
Figure 13:
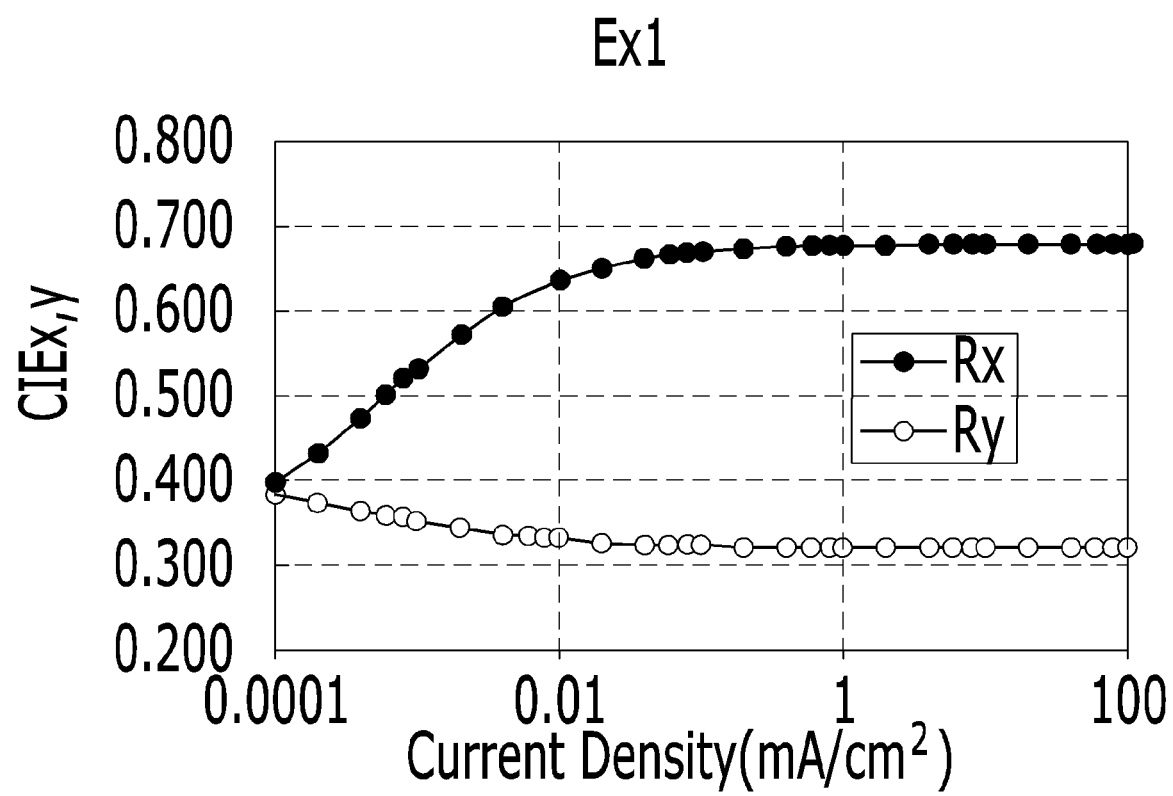
FIG. 13 is a graph showing CIEx and CIEy of the first experimental example.
Figure 14A:
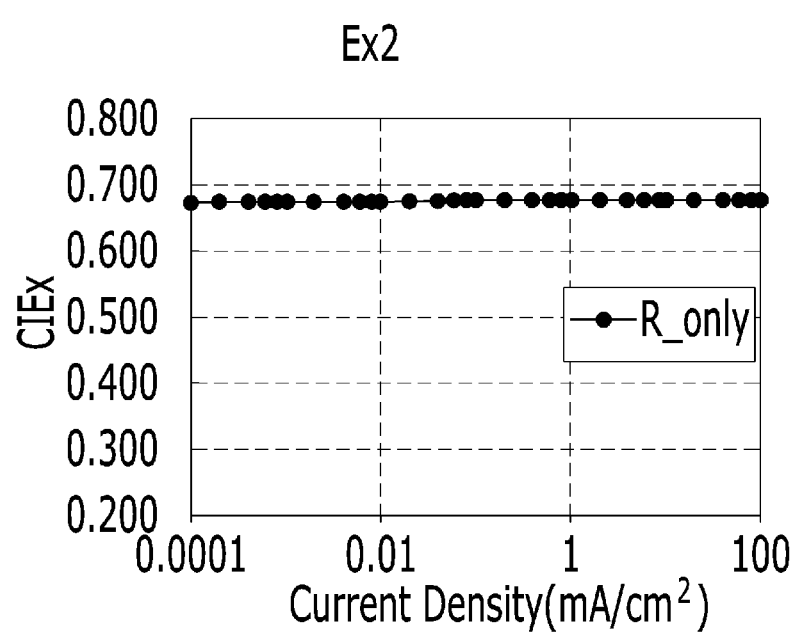
FIGS. 14A to 14C are graphs respectively showing CIEx of the second to fourth experimental examples.
Figure 14B:
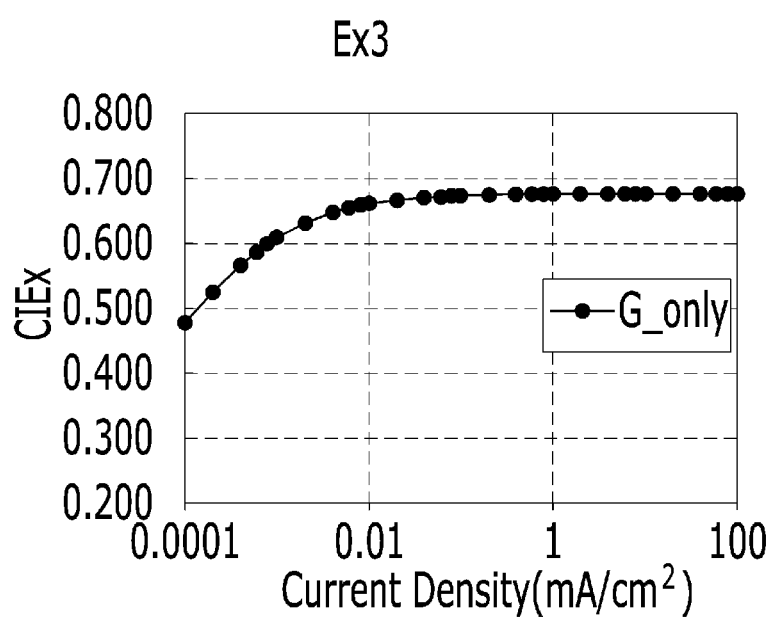
Figure 14C:
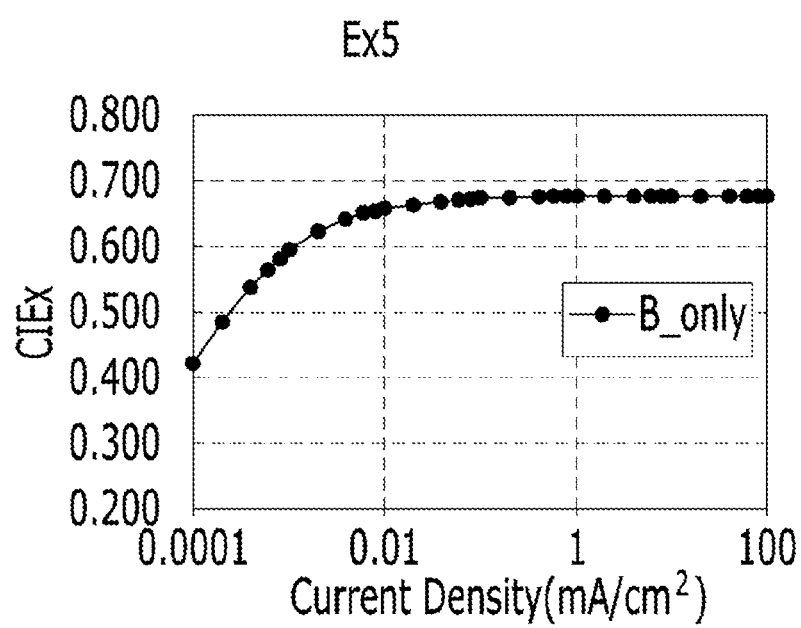
Figure 15A:
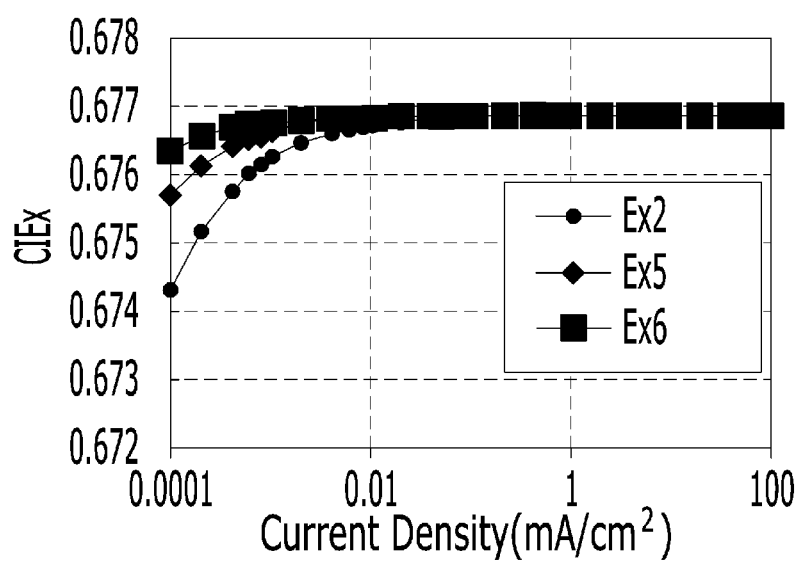
FIG. 15A is a graph showing CIEx of the second, fifth, and sixth experimental examples for comparison.
Figure 15B:
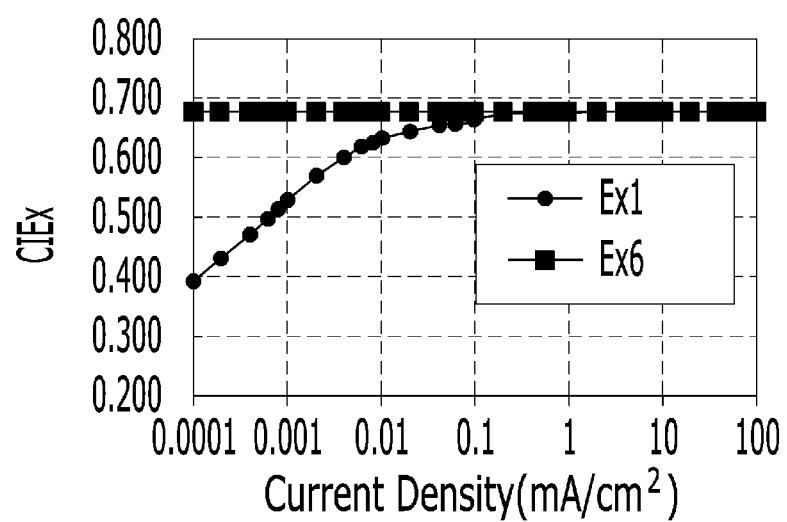
FIG. 15B is a graph showing CIEx of the first and sixth experimental examples for comparison.

FIGS. 12A to 12F are sectional views of first to sixth experimental examples, and FIG. 13 is a graph showing CIEx and CIEy of the first experimental example. FIGS. 14A to 14C are graphs respectively showing CIEx of the second to fourth experimental examples, FIG. 15A is a graph showing CIEx of the second, fifth, and sixth experimental examples for comparison, and FIG. 15B is a graph showing CIEx of the first and sixth experimental examples for comparison.

In the first experimental example (Ex1) to the sixth experimental example (Ex6) of FIGS. 12A to 12F, a red subpixel of the light emitting display device is shown in order to check an influence due to leakage light, and components that have no influence on outward emission on a substrate 100 are omitted. Each red subpixel includes a red conversion layer RCF in an emission portion, and a light emitting element OLED having the structure of FIG. 6 is included on a planarization layer 250 configured to cover the red conversion layer RCF so as to be flat. That is, the light emitting element OLED includes first to third stacks S1, S2, and S3 between a first electrode 110 and a second electrode 200. The first and third stacks S1 and S3 respectively have single blue emission layers 130 and 160, and the second stack S2 includes a hetero emission portion 140 in which a red emission layer 141, a yellowish green emission layer 142, and a green emission layer 143 are stacked.

In FIGS. 12A to 12F, a non-emission portion of the red subpixel includes a thin film transistor TFT, and an auxiliary conversion layer is or is not applied to an area that does not overlap the thin film transistor TFT. That is, as shown in FIG. 12A, in the first experimental example (Ex1), no auxiliary conversion layer is applied to the non-emission portion. As shown in FIG. 12B, in the second experimental example (Ex2), an auxiliary conversion layer ARCF identical to the red conversion layer RCF is applied to the non-emission portion. As shown in FIG. 12C, in the third experimental example (Ex3), an auxiliary conversion layer AGCF identical to a green conversion layer GCF is applied to the non-emission portion. As shown in FIG. 12D, in the fourth experimental example (Ex4), an auxiliary conversion layer BCF identical to a blue conversion layer BCF is applied to the non-emission portion. As shown in FIG. 12E, in the fifth experimental example (Ex5), a first auxiliary conversion layer AGCF identical to the green conversion layer GCF and a second auxiliary conversion layer ARCF identical to the red conversion layer RCF are applied to the non-emission portion. For the first and second auxiliary conversion layers AGCF and ARCF, common filter characteristics are important, and the first and second auxiliary conversion layers AGCF and ARCF have the same effect irrespective of top-down order. As shown in FIG. 12F, in the sixth experimental example (Ex6), a first auxiliary conversion layer ABCF identical to the blue conversion layer BCF and a second auxiliary conversion layer ARCF identical to the red conversion layer RCF are stacked in the non-emission portion. In the sixth experimental example (Ex6), common filter characteristics of the first and second auxiliary conversion layers ABCF and ARCF are also important, and the first and second auxiliary conversion layers ABCF and ARCF have the same effect irrespective of top-down order.

FIG. 13 shows color efficiency of the first experimental example (Ex1), wherein no auxiliary conversion portion is provided in the non-emission portion of the red subpixel. It can be seen that, when the value of CIEx is changed from 0.0001 mA/cm² to 1 mA/cm², there is a great change of about 0.300. The value of CIEy, which is variation due to a change in current density, is less than 0.0800, which has less volatility than the value of CIEx, and it can be seen that sensitivity in value of CIEx at the time of red display is great. When the value of CIEx when driven at low current density and the value of CIEx when driven at high current density are adjusted so as to be similar to each other, similar color coordinate values may be exhibited. Hereinafter, a change in value of CIEx in the second to sixth experimental examples (Ex2 to Ex6) will be described.

When a red auxiliary conversion layer ARCF is provided as the auxiliary conversion portion in the second experimental example (Ex2), as shown in FIG. 14A, it can be seen that red purity is remarkably improved. Also, in the third and fourth experimental examples (Ex3 and Ex4), it can be seen that the value of CIEx is increased at a current density of 0.0001 mA/cm², whereby some improvement is achieved, compared to the first experimental example (Ex1) of FIG. 13. When an auxiliary green conversion layer AGCF and an auxiliary blue conversion layer ABCF are provided as the auxiliary conversion layers of the third and fourth experimental examples (Ex3 and Ex4), compared to the second experimental example (Ex2), however, the effect is small. The reason for this is that, in tristimulus unique for a blue area, among side leakage emission components, an X tristimulus component that has a great influence on the red color has the smallest contribution. Also, in the third and fourth experimental examples (Ex3 and Ex4), green and blue leakage emission components are generated from the non-emission portion of the subpixel by the organic stack OS provided at the subpixels, and the green light and the blue light, among the leakage emission components, are transmitted through the auxiliary green conversion layer AGCF and the auxiliary blue conversion layer ABCF, whereby red purity is reduced.

Meanwhile, in the fifth and sixth experimental examples (Ex5 and Ex6), the red conversion layer provided in the second experimental example (Ex2) is included as a first auxiliary conversion layer ARCF, whereby an effect of excluding colors other than the red color is achieved, and a second auxiliary conversion layer AGCF/ABCF is further included as a color conversion layer having different transmission characteristics from the red color, whereby a filtering effect is improved.

It can be seen from FIG. 15A that, in the fifth and sixth experimental examples (Ex5 and Ex6) having the double-stacked structure, a change in value of CIEx at low and high current densities is small, compared to the second experimental example (Ex2) having the single red conversion layer structure.

The light emitting display device according to the present disclosure is based on the sixth experimental example (Ex6) in which a difference in color coordinates is the smallest when driven at low and high current densities by the provision of the auxiliary conversion portion, and it can be seen that the value of CIEx is changed within less than three decimal places. In the light emitting element of FIG. 6, contribution of the green emission layer is increased by peak characteristics of yellowish green emission mainly occurring at low current density due to structural characteristics thereof. At this time, a first auxiliary conversion layer ARCF configured to transmit red color and to block green and blue colors and a second auxiliary conversion layer ABCF configured to transmit blue color and to block red and green colors is disposed in the non-emission portion in a stacked state, whereby green emission amount due to increased side leakage is removed by a double filter effect, and therefore side leakage in the non-emission portion is prevented. In particular, when transmission spectra of the first auxiliary conversion layer ARCF and the second auxiliary conversion layer ABCF, the transmission range of which is certainly reduced, overlap each other, the amount of light transmitted through both the first and second auxiliary conversion layers ARCF and ABCF substantially disappears, whereby a black state is achieved, the amount of leakage light in the non-emission portion is prevented, and color purity of the red subpixel is greatly improved.

TABLE 1

| Experimental example | Auxiliary conversion portion | [Δu'v' at 10 mA/cm²] − [Δu'v' at 0.1 mA/cm²] |
|---|---|---|
| Ex1 | None | 0.282 |
| Ex2 | ARCF | 0.003 |
| Ex3 | AGCF | 0.197 |
| Ex4 | ABCF | 0.250 |
| Ex5 | ARCF + AGCF | 0.001 |
| Ex6 | ARCF + ABCF | 0.000 |

Table 1 shows color deviation based on a difference in value of CIEx at a current density of 10 mA/cm² and a current density of 0.1 mA/cm² in the first to sixth experimental examples. As shown in FIG. 15B and Table 1, color deviation is 0.282 in the first experimental example (Ex1), whereas color deviation is 0.000 in the sixth experimental example (Ex6), and therefore it can be seen that remarkable improvement is achieved when the auxiliary conversion portion according to the present disclosure is applied. When only a red conversion layer is used as the auxiliary conversion layer, some light may be helpful in improving red luminance. Since an actual light emitting display device includes a yellowish green emission layer, however, red intensity at very low current density is very low. In white driving due to side leakage, current density is very low due to characteristics thereof, and the red area of a white spectrum revealed in this area hardly exists. As a result, improvement of red purity may be low even though light leakage due to white light leakage is transmitted through the red conversion layer.

In the light emitting display device according to the present disclosure, therefore, the red conversion layer is used, and at the same time a blue conversion layer, the wavelength area of which is greatly reduced, is stacked, whereby it is possible to prevent lowering of color purity due to side leakage.

Hereinafter, CIEx color coordinate characteristics of a structure in which a single red conversion layer is applied to the lower non-emission portion, a structure in which a red conversion layer and a green conversion layer are stacked, and a structure in which a red conversion layer and a blue conversion layer are applied for device A and device B will be described.

Figure 16:
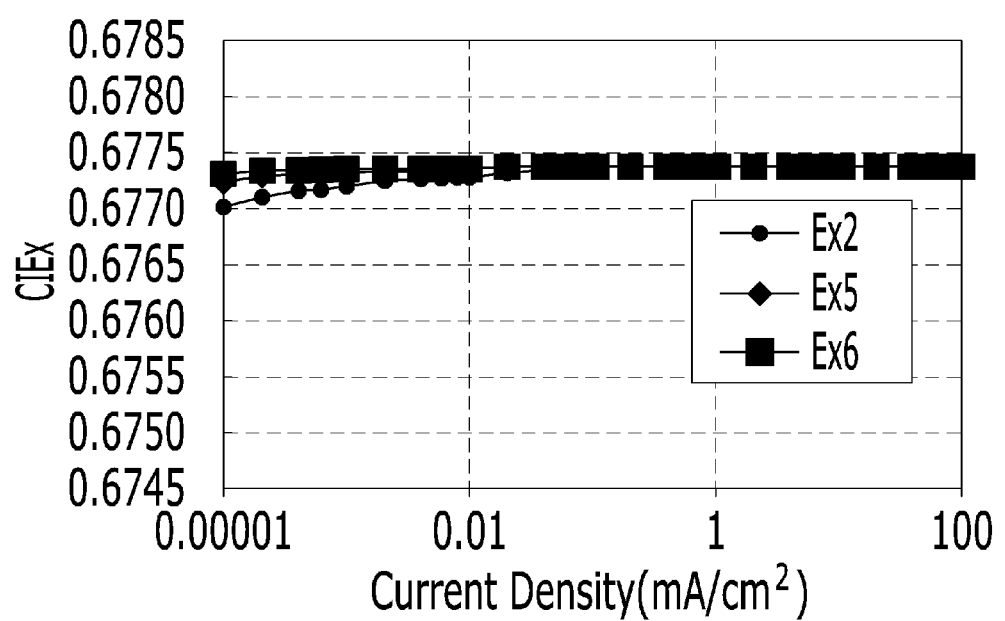
FIG. 16 is a graph showing CIEx when a single red conversion layer (Ex2a), a structure in which a red conversion layer and a green conversion layer are stacked (Ex5a), and a structure in which a red conversion layer and a blue conversion layer are stacked (Ex6a) are applied to a non-emission portion of device A for comparison.
Figure 17:
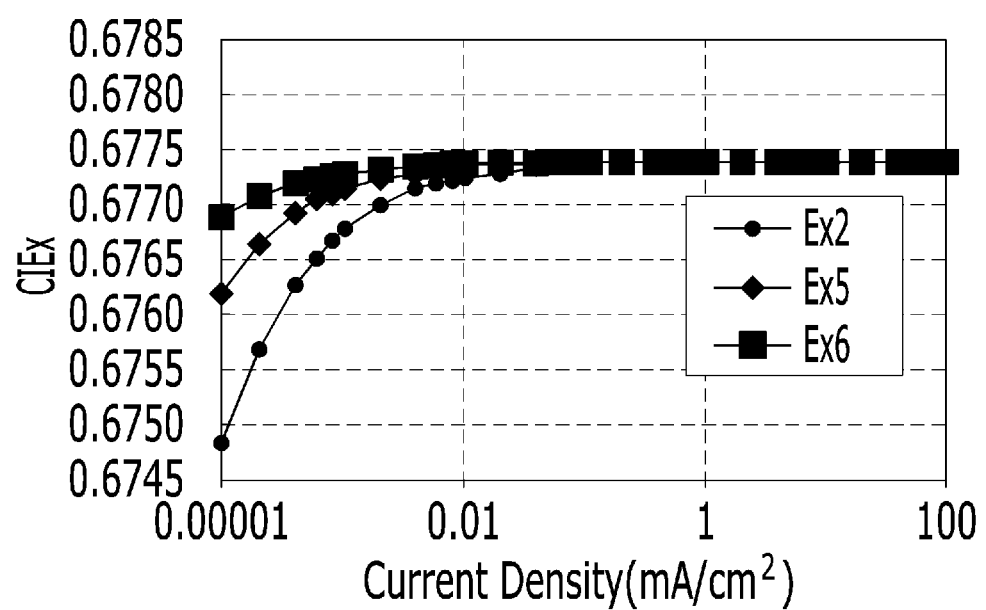
FIG. 17 is a graph showing CIEx when a single red conversion layer (Ex2), a structure in which a red conversion layer and a green conversion layer are stacked (Ex5), and a structure in which a red conversion layer and a blue conversion layer are stacked (Ex6) are applied to a non-emission portion of device B for comparison.

FIG. 16 is a graph showing CIEx when a single red conversion layer (Ex2a), a structure in which a red conversion layer and a green conversion layer are stacked (Ex5a), and a structure in which a red conversion layer and a blue conversion layer are stacked (Ex6a) are applied to the non-emission portion of device A for comparison, and FIG. 17 is a graph showing CIEx when a single red conversion layer (Ex2), a structure in which a red conversion layer and a green conversion layer are stacked (Ex5), and a structure in which a red conversion layer and a blue conversion layer are stacked (Ex6) are applied to the non-emission portion of device B for comparison.

As shown in FIG. 16, device A includes no green emission layer, whereby a change in value of CIEx at a low current density of 0.0001 mA/cm² is less than the device B. In a structure in which a single auxiliary red conversion layer ARCF is provided as the auxiliary conversion portion in the non-emission portion and a structure in which an auxiliary red conversion layer ARCF and an auxiliary blue conversion layer ABCF or an auxiliary green conversion layer AGCF are stacked, therefore, a change in value of CIEx is less than 0.0005, which is small, whereby it can be seen that an effect when an auxiliary conversion portion having a multilayered structure is insignificant.

As shown in FIG. 17, device B includes a green emission layer, and therefore it can be seen that, in the fifth and sixth experimental examples (Ex5 and Ex6) in which an auxiliary red conversion layer ARCF and another color conversion layer having different wavelength transmittance are provided, a change in color coordinates of CIEx at low current density is less than in the second experimental example (Ex2) in which a single red conversion layer is provided as the auxiliary conversion portion. Particularly, it can be seen that, in the sixth experimental example (Ex6), a change in value of CIEx at a low current density of 0.0001 mA/cm² is increased by 0.0020 or more, compared to the second experimental example (Ex2).

In the light emitting display device according to the present disclosure, an auxiliary conversion portion configured to have a structure in which a red conversion layer and a blue conversion layer are stacked is applied to the outside of a red emission portion under a light emitting element in a structure in which a red emission layer and a green emission layer, which has high efficiency, are provided in a hetero emission portion of the light emitting element in order to improve luminous efficacy, whereby colors causing leakage excluding a red color are blocked, and therefore red purity may be improved. In particular, it is possible to prevent color deviation at low and high current densities through the double-layered auxiliary conversion portion, whereby it is possible to achieve uniform color expression irrespective of current density, and therefore it is possible to improve image quality.

A light emitting display device according to an embodiment of the present disclosure may comprise a substrate comprising a first subpixel, a second subpixel, a third subpixel, and a fourth subpixel, each having an emission portion and a non-emission portion surrounding the emission portion; a red conversion layer, a green conversion layer, and a blue conversion layer on the substrate so as to correspond respectively to the emission portions of the first subpixel, the second subpixel, and the third subpixel; a first auxiliary conversion portion comprising a first auxiliary conversion layer to transmit red light and a second auxiliary conversion layer to transmit light having a wavelength shorter than a wavelength of the red light at the non-emission portion of the first subpixel, a planarization layer to cover the red conversion layer, the green conversion layer, the blue conversion layer, and the first auxiliary conversion portion; and a light emitting element over the first to fourth subpixels on the planarization layer, the light emitting element comprising a first electrode and a second electrode opposite each other, a first stack comprising a first blue emission layer and a second stack comprising a red emission layer and a green emission layer between the first electrode and the second electrode, and a first charge generation layer between the first and second stacks.

In a light emitting display device according to an embodiment of the present disclosure, the second auxiliary conversion layer may transmit light having a shorter wavelength of 100 nm to 220 nm than the first auxiliary conversion layer.

A light emitting display device according to an embodiment of the present disclosure may further comprise a second auxiliary conversion portion at the non-emission portion of the fourth subpixel, the second auxiliary conversion portion including a third auxiliary conversion layer located on a same layer as the red conversion layer and a fourth auxiliary conversion layer located on a same layer as the blue conversion layer.

A light emitting display device according to an embodiment of the present disclosure may further comprise a third auxiliary conversion portion having a fifth auxiliary conversion layer located on a same layer as the blue conversion layer at the non-emission portion of the second subpixel.

In a light emitting display device according to an embodiment of the present disclosure, the first electrode is separately provided to correspond to each of the first to fourth subpixels, and the first stack, the second stack, the first charge generation layer, and the second electrode are continuously provided at the first to fourth subpixels.

A light emitting display device according to an embodiment of the present disclosure may further comprise a bank at the non-emission portions of the first to fourth subpixels. At least one of the first auxiliary conversion portion and the second auxiliary conversion portion may overlap the bank.

In a light emitting display device according to an embodiment of the present disclosure, the first auxiliary conversion portion may be provided at the non-emission portion along an upper contour line and a lower contour line of the emission portion of the first subpixel. And the second auxiliary conversion portion may be provided at the non-emission portion along an upper contour line and a lower contour line of the emission portion of the fourth subpixel.

In a light emitting display device according to an embodiment of the present disclosure, the bank may overlap the red emission layer, the green emission layer, and the first blue emission layer.

A light emitting display device according to an embodiment of the present disclosure may further comprise a third stack between the second stack and the second electrode. The third stack may comprise a second blue emission layer.

In a light emitting display device according to an embodiment of the present disclosure, the second stack may further comprise a yellowish green emission layer between the red emission layer and the green emission layer. The yellowish green emission layer may have opposite surfaces abutting the red emission layer and the green emission layer.

A light emitting display device according to an embodiment of the present disclosure may further comprise a thin film transistor at the non-emission portion of each of the first to fourth subpixels. The first auxiliary conversion portion may not overlap the thin film transistor.

As is apparent from the above description, a light emitting display device according to the present disclosure has the following effects.

In the light emitting display device according to the present disclosure, an auxiliary conversion portion configured to have a structure in which a red conversion layer and a blue conversion layer are stacked is applied to the outside of a red emission portion under a light emitting element in a structure in which a red emission layer and a green emission layer, which has high efficiency, are provided in a hetero emission portion of the light emitting element in order to improve luminous efficacy, whereby colors causing leakage excluding a red color are blocked, and therefore red purity may be improved. In particular, it is possible to prevent color deviation at low and high current densities through the double-layered auxiliary conversion portion, whereby it is possible to achieve uniform color expression irrespective of current density, and therefore it is possible to improve image quality.

Also, in the light emitting display device according to the present disclosure, a double-layered auxiliary conversion portion is further provided outside a white emission portion, whereby it is possible to prevent lowering of red purity due to side leakage, and therefore it is possible to further improve image quality of the display device.

It will be apparent to those skilled in the art from the above description that various modifications and alterations are possible without departing the technical idea of the present disclosure. Therefore, the technical scope of the present disclosure should be restricted not by the above detailed description of the present disclosure but by the accompanying claims.

What is claimed is:

1. A light emitting display device comprising:
   a substrate comprising a first subpixel, a second subpixel, a third subpixel, and a fourth subpixel, each of the first, second, third, and fourth subpixels having an emission portion and a non-emission portion surrounding the emission portion;
   a red conversion layer, a green conversion layer, and a blue conversion layer on the substrate so as to correspond respectively to the emission portions of the first subpixel, the second subpixel, and the third subpixel;
   a first auxiliary conversion portion comprising a first auxiliary conversion layer to transmit red light and a second auxiliary conversion layer to transmit light having a wavelength shorter than a wavelength of the red light at the non-emission portion of the first subpixel;
   a planarization layer to cover the red conversion layer, the green conversion layer, the blue conversion layer, and the first auxiliary conversion portion; and
   a light emitting element over the first to fourth subpixels on the planarization layer, the light emitting element comprising a first electrode and a second electrode opposite each other, a first stack comprising a first blue emission layer and a second stack comprising a red emission layer and a green emission layer between the first electrode and the second electrode, and a first charge generation layer between the first and second stacks.

2. The light emitting display device according to claim 1, wherein the second auxiliary conversion layer transmits light having a shorter wavelength than the first auxiliary conversion layer by 100 nm to 220 nm.

3. The light emitting display device according to claim 1, further comprising a second auxiliary conversion portion at the non-emission portion of the fourth subpixel, the second auxiliary conversion portion including a third auxiliary conversion layer located on a same layer as the red conversion layer and a fourth auxiliary conversion layer located on a same layer as the blue conversion layer.

4. The light emitting display device according to claim 3, further comprising a third auxiliary conversion portion having a fifth auxiliary conversion layer located on a same layer as the blue conversion layer at the non-emission portion of the second subpixel.

5. The light emitting display device according to claim 1, wherein
   the first electrode is separately provided to correspond to each of the first to fourth subpixels, and
   the first stack, the second stack, the first charge generation layer, and the second electrode are continuously provided at the first to fourth subpixels.

6. The light emitting display device according to claim 3, further comprising a bank at the non-emission portions of the first to fourth subpixels, wherein at least one of the first auxiliary conversion portion and the second auxiliary conversion portion overlaps the bank.

7. The light emitting display device according to claim 3, wherein:
   the first auxiliary conversion portion is provided at the non-emission portion along an upper contour line and a lower contour line of the emission portion of the first subpixel, and
   the second auxiliary conversion portion is provided at the non-emission portion along an upper contour line and a lower contour line of the emission portion of the fourth subpixel.

8. The light emitting display device according to claim 6, wherein the bank overlaps the red emission layer, the green emission layer, and the first blue emission layer.

9. The light emitting display device according to claim 1, further comprising:
   a third stack between the second stack and the second electrode, wherein
   the third stack comprises a second blue emission layer.

10. The light emitting display device according to claim 1, wherein
    the second stack further comprises a yellowish green emission layer between the red emission layer and the green emission layer, and
    the yellowish green emission layer has opposite surfaces abutting the red emission layer and the green emission layer.

11. The light emitting display device according to claim 1, further comprising:
    a thin film transistor at the non-emission portion of each of the first to fourth subpixels, wherein
    the first auxiliary conversion portion does not overlap the thin film transistor.

12. A light emitting display device comprising:
    a plurality of pixels, each of the pixels including a first subpixel, a second subpixel, a third subpixel, and a fourth subpixel, each of the first, second, third, and fourth subpixels having an emission portion and a non-emission portion surrounding the emission portion;
    a first color conversion layer, a second color conversion layer, and a third color conversion layer corresponding to the emission portion of the first subpixel, the second subpixel, and the third subpixel, respectively; and
    a first auxiliary conversion portion disposed on the non-emission portion of the first subpixel, the first auxiliary conversion portion including a first auxiliary conversion layer to transmit the first color light and a second auxiliary conversion layer to transmit light of a different color from the first color light.

13. The light emitting display device according to claim 12, wherein the first color light is red light, the first auxiliary conversion layer to transmit the red light, and the second auxiliary conversion layer transmits light of a wavelength shorter than the red light.

14. The light emitting display device according to claim 13, wherein the second auxiliary conversion layer transmits blue light or green light.

15. The light emitting display device according to claim 13, wherein the second auxiliary conversion layer transmits light having a shorter wavelength than the first auxiliary conversion layer by 100 nm to 220 nm.

16. The light emitting display device according to claim 12, further comprising banks separating the emission portions of the first, second, third, and fourth sub-pixels, the first auxiliary conversion portion disposed to overlap one of the banks adjacent to the first sub-pixel.

17. The light emitting display device according to claim 12, wherein each of the first, second, third, and fourth sub-pixels includes a thin film transistor at the non-emission portion of each of the first, second, third, and fourth sub-pixels, and wherein the first auxiliary conversion portion does not overlap the thin film transistor in the first sub-pixel.

18. The light emitting display device according to claim 12, further comprising a second auxiliary conversion portion at the non-emission portion of the fourth subpixel, the second auxiliary conversion portion including a third auxiliary conversion layer located on a same layer as the first color conversion layer and a fourth auxiliary conversion layer located on a same layer as the third color conversion layer.

19. The light emitting display device according to claim 18, wherein:

the first auxiliary conversion portion is provided at the non-emission portion along an upper contour line and a lower contour line of the emission portion of the first subpixel, and the second auxiliary conversion portion is provided at the non-emission portion along an upper contour line and a lower contour line of the emission portion of the fourth subpixel.

20. The light emitting display device according to claim 12, wherein each of the first subpixel, the second subpixel, the third subpixel and the fourth subpixel comprises a corresponding light emitting device including a first organic stack, a second organic stack, and a first charge generation layer between the first organic stack and the second organic stack.

* * * * *